United States Patent
Banik et al.

(10) Patent No.: US 11,295,250 B2
(45) Date of Patent: Apr. 5, 2022

(54) SIMULATION QUEUING BASED SYSTEM FOR ANALYZING CLIENT OR APPLICATION RELATED CHANGES TO AN APPLICATION MAINTENANCE PROJECT

(71) Applicant: Accenture Global Solutions Limited, Dublin (IE)

(72) Inventors: Avikar Banik, Kolkata (IN); Jenice James Mukkada, Kolkata (IN); Koustuv Jana, Bangalore (IN); Divya Sampathkumar, Bangalore (IN); Rajendra T. Prasad, Bangalore (IN); Priya Athreyee, Chennai (IN)

(73) Assignee: Accenture Global Solutions Limited, Dublin (IE)

( * ) Notice: Subject to any disclaimer, the term of this patent is extended or adjusted under 35 U.S.C. 154(b) by 733 days.

(21) Appl. No.: 15/650,298

(22) Filed: Jul. 14, 2017

(65) Prior Publication Data
US 2018/0018617 A1 Jan. 18, 2018

(30) Foreign Application Priority Data
Jul. 18, 2016 (IN) .............................. 201641024538

(51) Int. Cl.
*G06Q 10/06* (2012.01)
*H04L 12/24* (2006.01)
(Continued)

(52) U.S. Cl.
CPC ..... *G06Q 10/063118* (2013.01); *G06F 30/20* (2020.01); *G06Q 10/06315* (2013.01);
(Continued)

(58) Field of Classification Search
CPC combination set(s) only.
See application file for complete search history.

(56) References Cited

U.S. PATENT DOCUMENTS 5,617,342 A * 4/1997 Elazouni ................. G06F 30/20
703/6
7,421,372 B1 * 9/2008 Moss ..................... G06Q 10/06
702/184
(Continued)

FOREIGN PATENT DOCUMENTS

GB 2293900 A * 4/1996 ............. G06F 30/20

OTHER PUBLICATIONS

C. Bartolini, C. Stefanelli and M. Tortonesi, "SYMIAN: Analysis and performance improvement of the IT incident management process," in IEEE Transactions on Network and Service Management, vol. 7, No. 3, pp. 132-144, Sep. 2010, doi: 10.1109/TNSM.2010.1009.I9P0321. (Year: 2010).*

*Primary Examiner* — Crystol Stewart
(74) *Attorney, Agent, or Firm* — Harrity & Harrity, LLP

(57) ABSTRACT

A device may receive group information, associated with performing application maintenance, that includes information corresponding to one or more resources, associated with performing the application maintenance, and information associated with one or more shifts of the one or more resources. The device may receive ticket information, associated with performing the application maintenance, that includes priority information associated with one or more ticket types associated with performing the application maintenance. The device may simulate, based on the group information and the ticket information, performing the application maintenance to determine a simulation result. The simulation result may include information associated with one or more predicted performance metrics associated with performing the application maintenance. The device may provide the information associated with the one or more predicted performance metrics.

20 Claims, 22 Drawing Sheets

(51) Int. Cl.
    *G06F 30/20*    (2020.01)
    *G09B 9/00*     (2006.01)
    *G06Q 10/00*    (2012.01)
    *G06F 9/50*     (2006.01)
    *H04L 41/50*    (2022.01)
    *H04L 43/55*    (2022.01)
    *H04L 41/5009*  (2022.01)

(52) U.S. Cl.
    CPC .......... *G06Q 10/063112* (2013.01); *G06Q 10/063114* (2013.01); *G06Q 10/20* (2013.01); *G09B 9/00* (2013.01); *H04L 41/5016* (2013.01); *H04L 41/5032* (2013.01); *H04L 41/5038* (2013.01); *G06F 9/5005* (2013.01); *G06F 9/5088* (2013.01)

(56) References Cited

U.S. PATENT DOCUMENTS

| | | | | |
|---|---|---|---|---|
| 2002/0073364 A1* | 6/2002 | Katagiri | ............... | G06F 11/327 714/48 |
| 2004/0073468 A1* | 4/2004 | Vyas | ............... | G06Q 10/0639 705/7.13 |
| 2004/0148604 A1* | 7/2004 | Steffens | ............. | G06F 11/3419 718/100 |
| 2007/0100584 A1* | 5/2007 | August | ................ | G06Q 10/06 702/184 |
| 2008/0177887 A1* | 7/2008 | Theilmann | ......... | G06F 11/3457 709/229 |
| 2009/0035736 A1* | 2/2009 | Wolpert | ................ | G09B 19/00 434/219 |
| 2010/0094592 A1* | 4/2010 | Cherkasova | ....... | G06F 11/3466 702/182 |
| 2010/0162257 A1* | 6/2010 | Hiltunen | .................. | G06F 9/50 718/104 |
| 2011/0066449 A1* | 3/2011 | Backhaus | ............. | G06Q 10/06 705/2 |
| 2011/0184771 A1* | 7/2011 | Wells | ..................... | G06Q 10/04 705/7.14 |
| 2012/0095734 A1* | 4/2012 | Moll | ..................... | G06Q 10/06 703/2 |
| 2014/0032768 A1* | 1/2014 | Ding | ...................... | G06F 9/505 709/226 |
| 2014/0136260 A1* | 5/2014 | Dasgupta | ....... | G06Q 10/063118 705/7.17 |
| 2014/0244331 A1* | 8/2014 | Boumas | ........ | G06Q 10/063116 705/7.16 |
| 2014/0244333 A1* | 8/2014 | Boumas | ........ | G06Q 10/063116 705/7.16 |
| 2015/0106143 A1* | 4/2015 | Rai | .................... | H04L 41/0823 705/7.14 |
| 2016/0005242 A1* | 1/2016 | Hua | ....................... | G06Q 10/00 701/29.3 |
| 2016/0036718 A1* | 2/2016 | Shingari | ............ | H04L 41/5074 709/226 |
| 2016/0148291 A1* | 5/2016 | Andersson | ...... | G06Q 10/063115 705/26.35 |
| 2016/0224915 A1* | 8/2016 | Venkata | .......... | G06Q 10/06312 |
| 2016/0301732 A1* | 10/2016 | Moretto | ................. | H04L 43/50 |
| 2017/0068923 A1* | 3/2017 | Kenkre | .......... | G06Q 10/063114 |
| 2017/0221001 A1* | 8/2017 | Chandrasekaran | .. | G06Q 10/105 |
| 2017/0277620 A1* | 9/2017 | Kadioglu | ................ | G06F 7/588 |
| 2017/0346690 A1* | 11/2017 | Dorado | .............. | H04L 41/5045 |
| 2018/0034965 A1* | 2/2018 | te Booij | ............. | H04M 3/5232 |

* cited by examiner

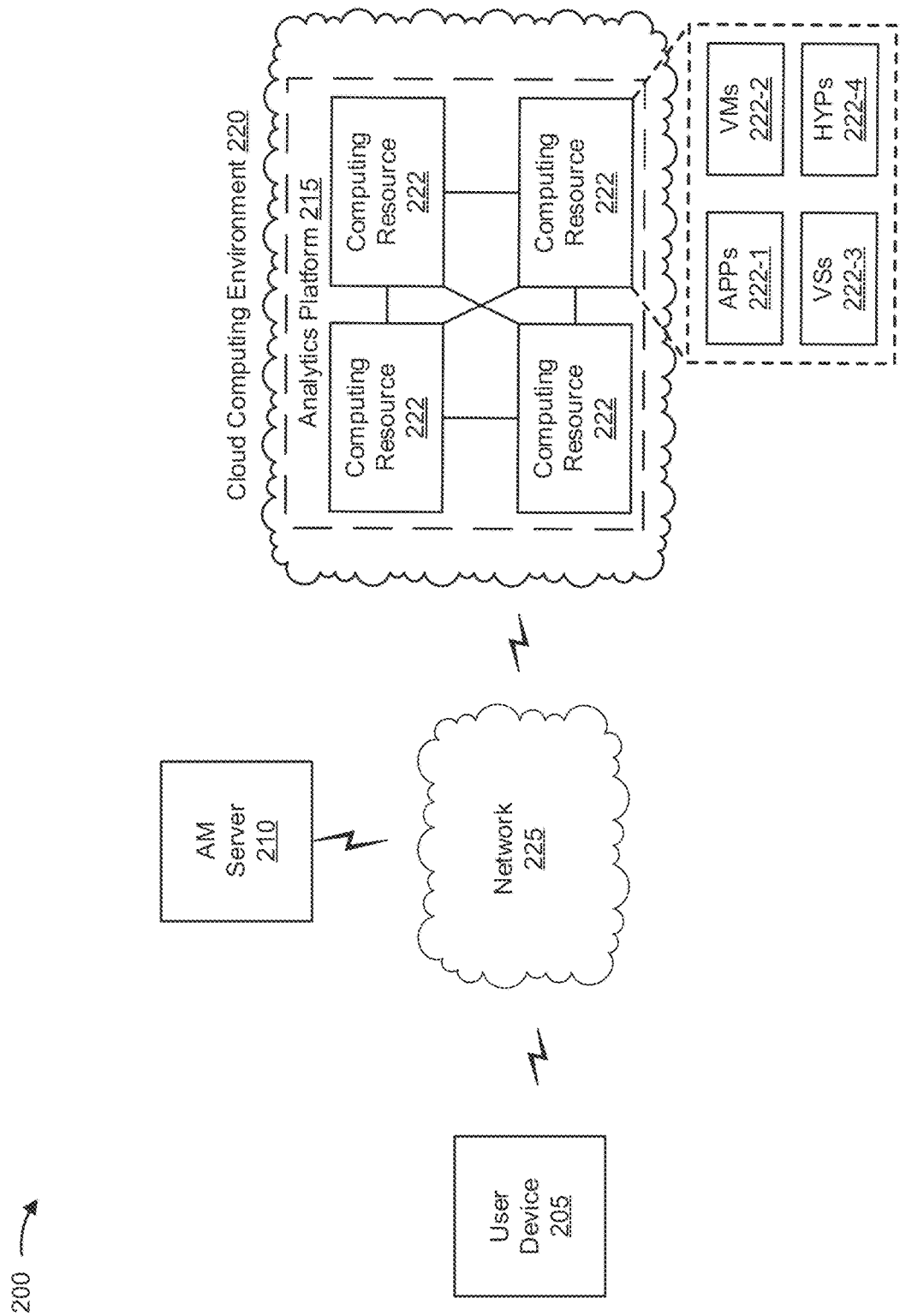

| Shift Name* | Shift Start time | | Shift End time | | Shift Preference | % Target Utilization | +/- Difference (Hr) to convert to Server Time Zone | Number of Resources available for Weekend Support | Clear the shift details |
|---|---|---|---|---|---|---|---|---|---|
| | Hours* | Mins | Hours* | Mins | | | | | |
| Shift A | 7 | 30 | 17 | 30 | 1 | 100.00 | + 0 | 0 | ⊗ |
| Shift B | 13 | 30 | 23 | 30 | 1 | 100.00 | + 0 | 0 | ⊗ |

Selected Group : Grp_Coles Online

[+ ADD SHIFT]

| Expertize | Level 0 | Level 1 | Level 2 | Level 3 | Level 4 |
|---|---|---|---|---|---|
| Relative Efforts | 100 | 80 | 60 | 60 | 100 |

Resource details with designation/expertize details*

| Designation | | ASE | | | | SE | | | | SSE | | | | TL | | | | AM | | | | M | | |
|---|---|---|---|---|---|---|---|---|---|---|---|---|---|---|---|---|---|---|---|---|---|---|---|---|---|
| Expertize Level | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| Skill A | 0 | 0 | 0 | 0 | 0 | 0 | 0 | 0 | 0 | 0 | 0 | 1 | 0 | 2 | 0 | 0 | 0 | 2 | 4 | 0 | 0 | 1 | 0 | 3 | 0 |
| Skill B | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

| Ticket Inflow Details | | Monthly Efforts | | Inflow Pattern | | |
|---|---|---|---|---|---|---|
| | | | | | Weekday % Of Tickets | Weekend % Of Tickets |
| Monthly Ticket Inflow | 525 | Monitoring (Hrs.) | 0 | Time Over The Day | | |
| % of inflow during weekdays | 95.00 | Enhancements (Hrs.) | 0 | 00:00 - 02:59 | 0.00 | 0.00 |
| % of inflow during weekends | 5.00 | | | 03:00 - 05:59 | 30.00 | 0.00 |
| Existing Backlog | 0 | | | 06:00 - 08:59 | 35.00 | 0.00 |
| | | | | 09:00 - 11:59 | 10.00 | 0.00 |
| | | | | 12:00 - 14:59 | 15.00 | 0.00 |

| Ticket Type | Ticket Priority | Service Window Type | SLA target (Hrs.) | SLA Compliance Target | Service Window Start Time | | Service Window End Time | | +/- TimeZone Difference | |
|---|---|---|---|---|---|---|---|---|---|---|
| | | | | | Hours | Mins | Hours | Mins | +/- | Hr |
| Incident | P1 | X7 ∨ | 24.00 | 90.00 | 0 | 1 | 23 | 59 | + | 0 |
| Incident | P2 | X7 ∨ | 48.00 | 90.00 | 0 | 1 | 23 | 59 | + | 0 |
| Incident | P3 | X5 ∨ | 240.00 | 90.00 | 0 | 1 | 23 | 59 | + | 0 |

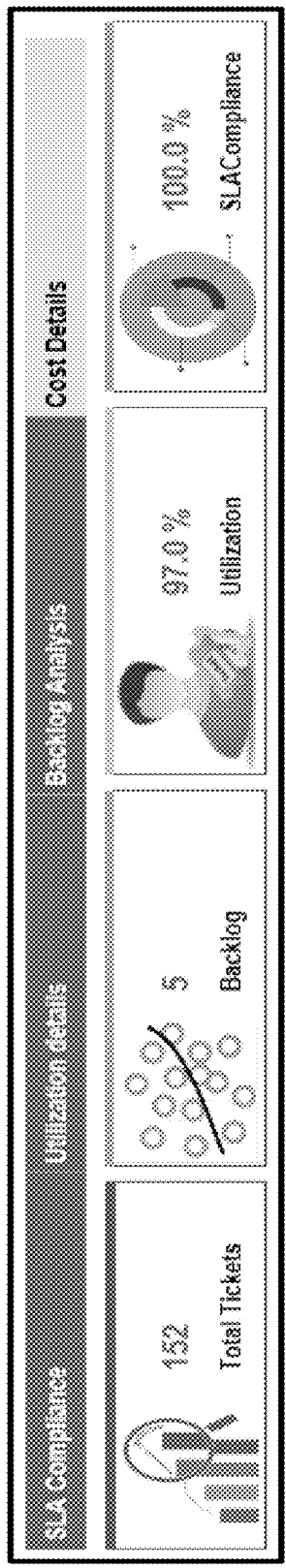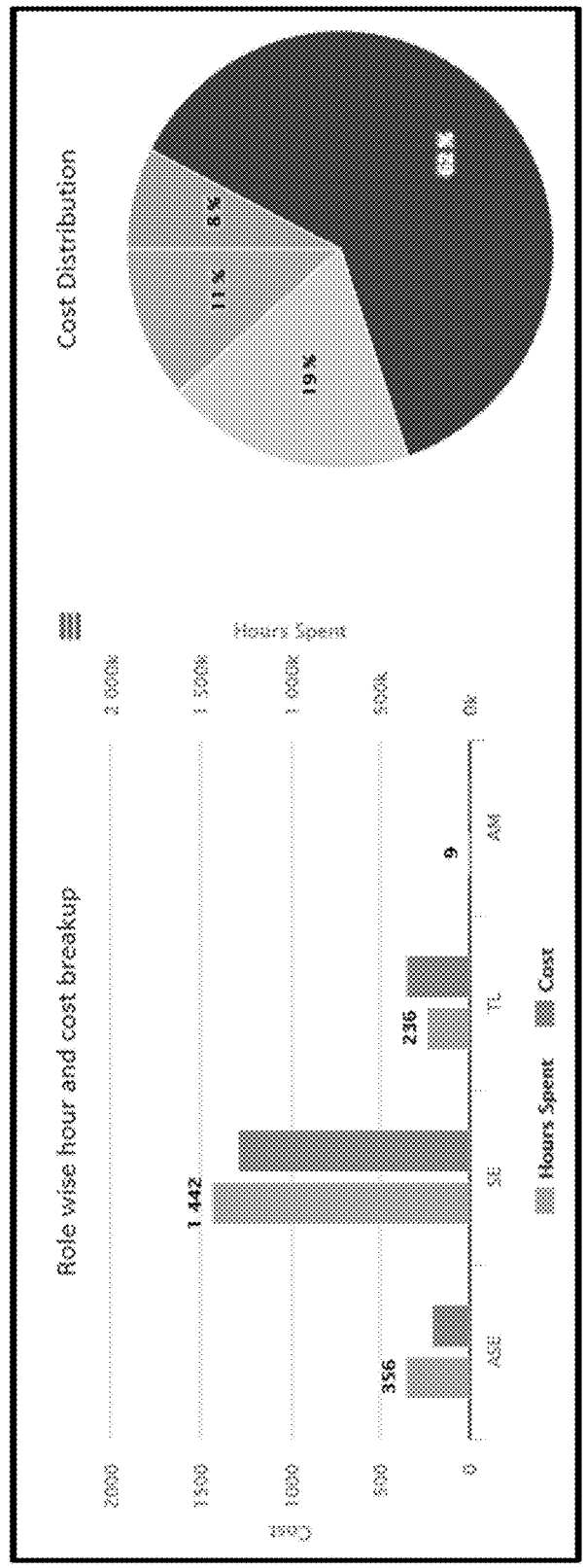
FIG. 5I

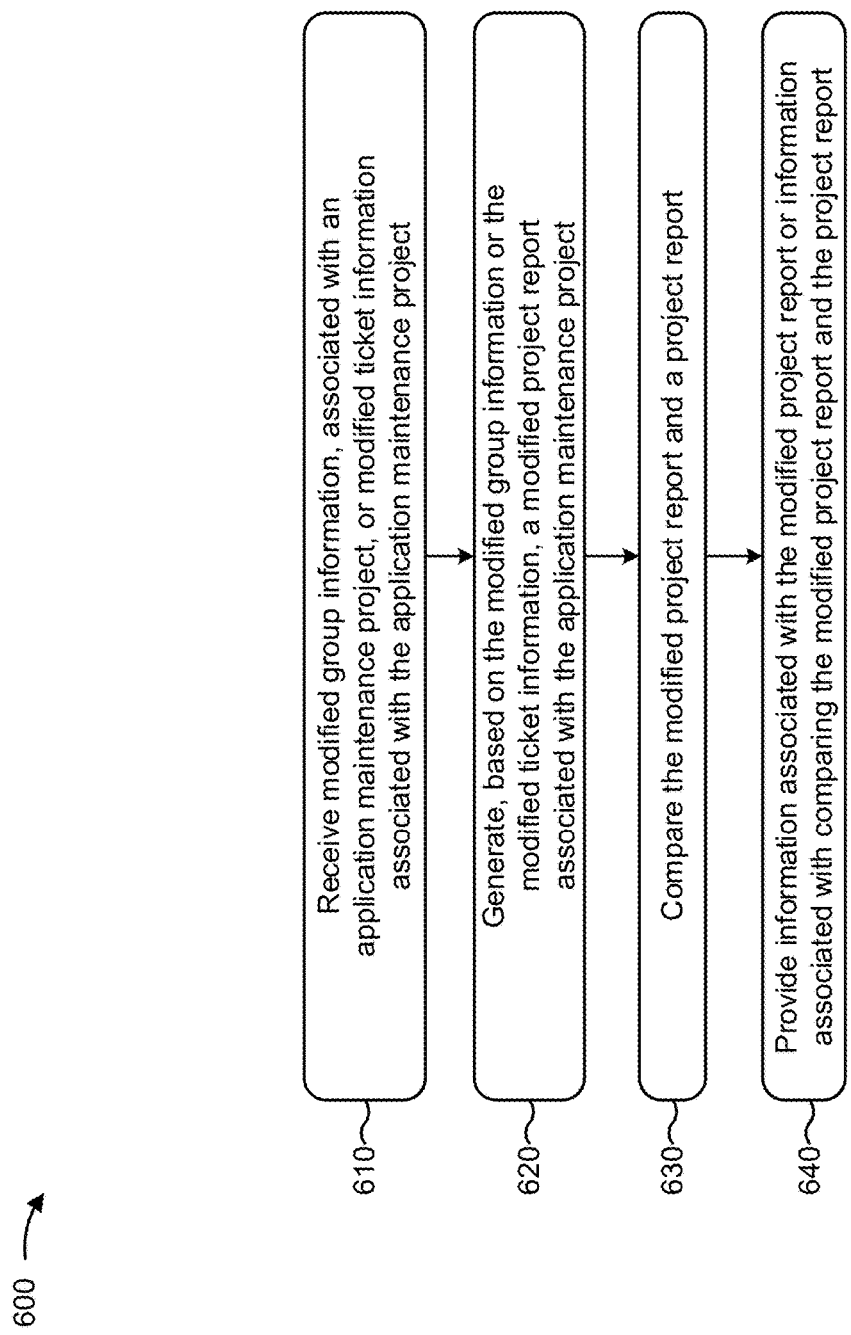

FIG. 7B

SIMULATION QUEUING BASED SYSTEM FOR ANALYZING CLIENT OR APPLICATION RELATED CHANGES TO AN APPLICATION MAINTENANCE PROJECT

RELATED APPLICATION

This application claims priority under 35 U.S.C. § 119 to Indian Patent Application No. 201641024538, filed on Jul. 18, 2016, the content of which is incorporated by reference herein in its entirety.

BACKGROUND

Application maintenance may involve modification of software applications after delivery to correct faults, improve performance or other attributes, or adapt to a changed environment. Application maintenance may be undertaken by a developer of the application or by a different party, such as an entity who specializes in application maintenance and/or related services. An application maintenance project typically involves a commitment of resources (e.g., personnel or computing resources), and may be preceded by an estimation of the resources required to perform the application maintenance project.

SUMMARY

According to some possible implementations, a device may include one or more processors to: receive group information, associated with performing application maintenance, that includes information corresponding to one or more resources, associated with performing the application maintenance, and information associated with one or more shifts of the one or more resources; receive ticket information, associated with performing the application maintenance, that includes priority information associated with one or more ticket types associated with performing the application maintenance; simulate, based on the group information and the ticket information, performing the application maintenance to determine a simulation result, where the simulation result may include information associated with one or more predicted performance metrics associated with performing the application maintenance; and provide the information associated with the one or more predicted performance metrics.

According to some possible implementations, a method may include determining, by a device, group information associated with an application maintenance project, where the group information may include information corresponding to one or more resources associated with the application maintenance project, and where the group information including information associated with one or more shifts of the one or more resources; determining, by the device, ticket information associated with the application maintenance project, where the ticket information may include information associated with one or more ticket types corresponding to the application maintenance project; simulating, based on the group information and the ticket information, a performance of application maintenance, associated with the application maintenance project, to determine a simulation result, where the simulation result may include information associated with one or more predicted performance metrics associated with the simulated performance of application maintenance; and providing, by the device and based on the simulation result, information associated with the simulation result.

According to some possible implementations, a non-transitory computer-readable medium may store that, when executed by one or more processors, cause the one or more processors to: receive group information, associated with performing application maintenance, that includes information corresponding to one or more resources, associated with performing the application maintenance, and information associated with one or more shifts of the one or more resources; receive ticket information, associated with performing the application maintenance, that includes information associated with a set of ticket types associated with performing the application maintenance; simulate, based on the group information and the ticket information, performance of the application maintenance to determine a simulation result, where the simulation result may include information associated with one or more predicted performance metrics associated with the simulated performance of the application maintenance; and provide the information associated with the one or more predicted performance metrics.

BRIEF DESCRIPTION OF THE DRAWINGS

FIG. 2 is a diagram of an example environment in which systems and/or methods, described herein, may be implemented;

FIGS. 5A-5I are diagrams of an example implementation relating to the example process shown in FIG. 4;

FIG. 6 is a flow chart of an example process for generating a modified project report, associated with an application maintenance project, and comparing the modified project report to a project report associated with the application maintenance project; and FIGS. 7A-7G are diagrams of an example implementation relating to the example process shown in FIG. 6.

DETAILED DESCRIPTION

Figure 1A:
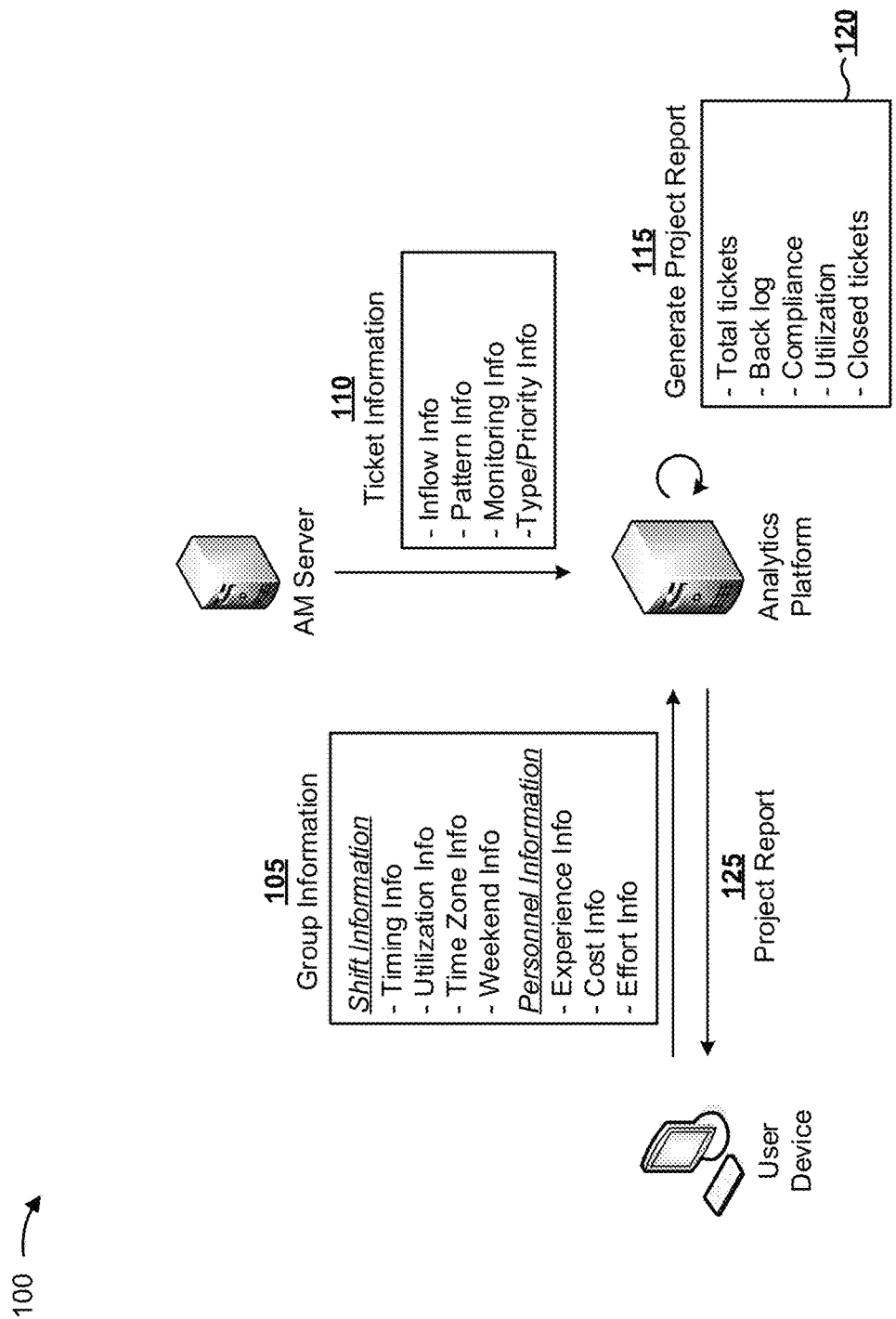
FIGS. 1A and 1B are diagrams of an overview of an example implementation described herein.

The following detailed description of example implementations refers to the accompanying drawings. The same reference numbers in different drawings may identify the same or similar elements.

Before undertaking an application maintenance project, a potential provider of the application maintenance may perform an estimation of the resources that may be required to complete the project. Typical techniques of estimation for an application maintenance project may focus on an amount of effort required per ticket and an amount of ticket inflow. In reality, however, multiple other factors may contribute to efficacy and/or efficiency of an application maintenance project, such as factors associated with a group that is to perform the application maintenance (e.g., factors associated with personnel shifts, factors associated with personnel included in the group, such as skill proficiency, or the like) and other factors associated with tickets to be resolved (e.g., existing backlogs, ticket types, ticket priorities, ticket inflow patterns, service level agreements (SLAs), or the like). A group may include a pool of resources (e.g., one or more personnel, one or more computing resources) associated with providing application maintenance support for one or more applications. In some implementations, different groups may be associated with one or more different applications. Here, typical estimation techniques may not accurately predict the performance of application maintenance, which may result in an over-commitment or under-commitment of resources, an inefficient use of personnel, negatively impacted application maintenance, or the like.

Implementations described herein provide an analytics platform capable of analyzing group information associated with an application maintenance project, analyzing ticket information associated with the application maintenance project, and generating a project report that includes a set of expected performance metrics associated with the application maintenance project.

In some implementations, the analytics platform may determine modified group information and/or modified ticket information, and may generate a modified project report associated with the application maintenance project. In such a case, the analytics platform may compare the project report and the modified project report, and may provide a result associated with the comparison (e.g., such that a user may identify a manner in which the application maintenance project could be modified to provide improved application maintenance).

In this way, performance of application maintenance may be improved by, for example, allowing for efficient and effective allocation of resources (e.g., computing resources or personnel) for performing application maintenance. Additionally, the performance of application maintenance may be improved based on the project report and/or the modified project report, thereby improving overall performance and/or operation of the application. Furthermore, improved performance of the application, resulting from the improved application maintenance, may allow system software and hardware (e.g., associated with executing and/or hosting the application) to function more efficiently and/or effectively.

Figure 1B:
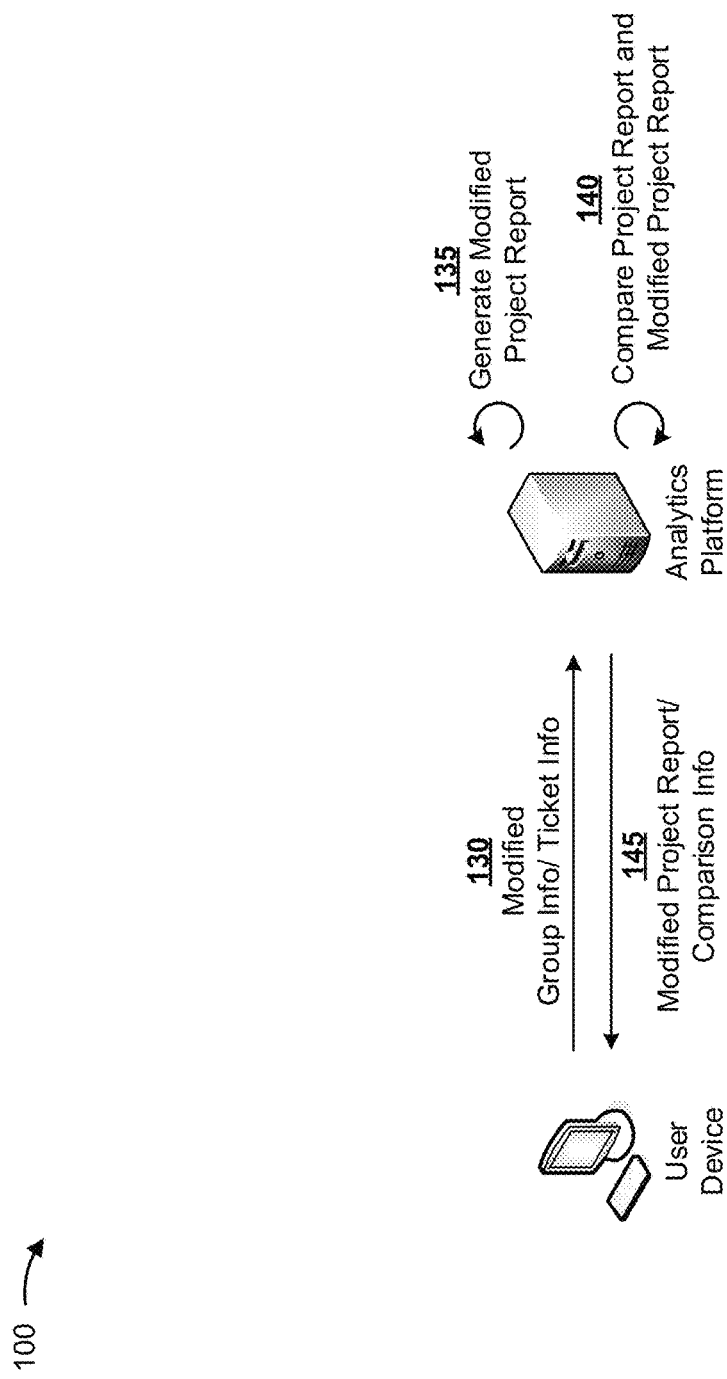

FIGS. 1A and 1B are diagrams of an overview of an example implementation 100 described herein. As shown in FIG. 1A, an analytics platform may send and/or receive data to or from a user device and/or an application management server (shown as "AM server"). As shown by reference number 105, the analytics platform may receive group information (e.g., information associated with one or more personnel who may be assigned to perform application maintenance associated with an application). As shown, the group information may include shift information that includes information associated with one or more shifts of a group of personnel during which the application maintenance project is performed. For example, as shown, the shift information may include timing information, utilization information, time zone information, weekend information, or the like. As further shown, the group information may include personnel information that includes information that identifies attributes and/or characteristics of the one or more personnel included in the group. For example, as shown, the personnel information may include experience information, cost information, effort information, or the like. Additional details regarding these types of group information are described below with regard to FIG. 4.

As shown by reference number 110, the analytics platform may receive ticket information from, for example, the application management server. In some implementations, the analytics platform may receive the ticket information from the user device. The ticket information may include information associated with tickets based on which application maintenance is to be performed. For example, the ticket information may include inflow information, pattern information, monitoring information, ticket type information, priority information, or the like. Additional details regarding these types of ticket information are described below with regard to FIG. 4.

As shown by reference number 115, the analytics platform may generate a project report 120 associated with an application maintenance project. In some implementations, the analytics platform may generate project report 120 based on the group information and/or the ticket information. Project report 120 may include information reporting performance metrics associated with performing application maintenance, such as total tickets, backlog, closed tickets, compliance metrics, utilization metrics, or the like. As shown by reference number 125, the analytics platform may send project report information (e.g., project report 120) to the user device.

As shown in FIG. 1B, and by reference number 130, the analytics platform may receive modified group information and/or modified ticket information from, for example, the user device. The modified group information or modified ticket information may be group information and/or ticket information as described above, but modified to reflect a change in one or more aspects of the group information or ticket information (e.g., an expected change to personnel, a desired changed to personnel, a possible change to ticket inflow, or the like).

As shown by reference number 135, the analytics platform may generate a modified project report. The modified project report may be similar to project report 120, but modified to reflect changes resulting from the changes in the modified group information and/or modified ticket information.

As shown by reference number 140, the analytics platform may compare the project report and the modified project report. For example, the analytics platform may compare one or more performance metrics associated with the project report and the modified project report, such as total tickets, backlog, closed tickets, compliance metrics, utilization metrics, or the like. As shown by reference number 145, the analytics platform may provide the modified project report and/or comparison information, associated with comparing the project report and the modified project report, to the user device.

In this way, performance of application maintenance may be improved by, for example, allowing for efficient and effective allocation of resources (e.g., computing resources or personnel) for performing application maintenance. Additionally, the performance of application maintenance may be improved based on the project report and/or the modified project report, thereby improving overall performance of the application. Furthermore, improved performance of the application, resulting from the improved application maintenance, may allow system software and hardware (e.g., associated with performing the application), to function more efficiently and/or effectively.

As indicated above, FIGS. 1A and 1B are provided merely as an example. Other examples are possible and may differ from what was described with regard to FIGS. 1A and 1B.

FIG. 2 is a diagram of an example environment 200 in which systems and/or methods, described herein, may be implemented. As shown in FIG. 2, environment 200 may include a user device 205, an application management (AM) server 210, an analytics platform 215 hosted within a cloud computing environment 220, and a network 225. Devices of environment 200 may interconnect via wired connections, wireless connections, or a combination of wired and wireless connections.

User device 205 includes one or more devices capable receiving, storing, and/or providing group information, associated with an application maintenance project, and/or ticket information associated with the application maintenance project. For example, user device 205 may include a communication and/or computing device, such as a mobile phone (e.g., a smart phone, a radiotelephone, etc.), a laptop computer, a tablet computer, a handheld computer, a gaming device, a wearable communication device (e.g., a smart wristwatch, a pair of smart eyeglasses, a sensor, etc.), or a similar type of device. In some implementations, user device 205 may be capable of receiving and/or providing information associated with a project report corresponding to the application maintenance project.

AM server 210 includes one or more devices capable of receiving, storing, and/or providing ticket information associated with an application that is the subject of an application maintenance project. In some implementations, AM server 210 may be capable of receiving, storing, and/or providing group information associated with an application. For example, AM server 210 may include a server or a group of servers. In some implementations, AM server 210 may host an application associated with the application maintenance project and/or may store the ticket information (e.g., such that AM server 210 may provide the ticket information to analytics platform 215).

Analytics platform 215 includes one or more devices capable of determining group information, associated with an application maintenance project, and ticket information, associated with the application maintenance project, and generating a project report, associated with the application maintenance project, based on the group information and the ticket information. For example, analytics platform 215 may include a server or a collection of servers.

In some implementations, as shown, analytics platform 215 may be hosted in cloud computing environment 220. Notably, while implementations described herein describe analytics platform 215 as being hosted in cloud computing environment 220, in some implementations, analytics platform 215 may not be cloud-based (i.e., may be implemented outside of a cloud computing environment) or may be partially cloud-based.

Cloud computing environment 220 includes an environment that hosts analytics platform 215. Cloud computing environment 220 may provide computation, software, data access, storage, etc. services that do not require end-user (e.g., user device 205 and/or AM server 210) knowledge of a physical location and configuration of system(s) and/or device(s) that hosts analytics platform 215. As shown, cloud computing environment 220 may include a group of computing resources 222 (referred to collectively as "computing resources 222" and individually as "computing resource 222").

Computing resource 222 may include one or more personal computers, workstation computers, server devices, or another type of computation and/or communication device. In some implementations, computing resource 222 may host analytics platform 215. The cloud resources may include compute instances executing in computing resource 222, storage devices provided in computing resource 222, data transfer devices provided by computing resource 222, etc. In some implementations, computing resource 222 may communicate with other computing resources 222 via wired connections, wireless connections, or a combination of wired and wireless connections.

As further shown in FIG. 2, computing resource 222 may include a group of cloud resources, such as one or more applications ("APPs") 222-1, one or more virtual machines ("VMs") 222-2, virtualized storage ("VSs") 222-3, one or more hypervisors ("HYPs") 222-4, or the like.

Application 222-1 may include one or more software applications that may be provided to or accessed by user device 205. Application 222-1 may eliminate a need to install and execute the software applications on user device 205. For example, application 222-1 may include software associated with analytics platform 215 and/or any other software capable of being provided via cloud computing environment 220. In some implementations, one application 222-1 may send/receive information to/from one or more other applications 222-1, via virtual machine 222-2.

Virtual machine 222-2 may include a software implementation of a machine (e.g., a computer) that executes programs like a physical machine. Virtual machine 222-2 may be either a system virtual machine or a process virtual machine, depending upon use and degree of correspondence to any real machine by virtual machine 222-2. A system virtual machine may provide a complete system platform that supports execution of a complete operating system ("OS"). A process virtual machine may execute a single program, and may support a single process. In some implementations, virtual machine 222-2 may execute on behalf of a user (e.g., user device 205), and may manage infrastructure of cloud computing environment 220, such as data management, synchronization, or long-duration data transfers.

Virtualized storage 222-3 may include one or more storage systems and/or one or more devices that use virtualization techniques within the storage systems or devices of computing resource 222. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

Hypervisor 222-4 may provide hardware virtualization techniques that allow multiple operating systems (e.g., "guest operating systems") to execute concurrently on a host computer, such as computing resource 222. Hypervisor 222-4 may present a virtual operating platform to the guest operating systems, and may manage the execution of the guest operating systems. Multiple instances of a variety of operating systems may share virtualized hardware resources.

Network 225 includes one or more wired and/or wireless networks. For example, network 225 may include a cellular network (e.g., a long-term evolution (LTE) network, a 3G network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
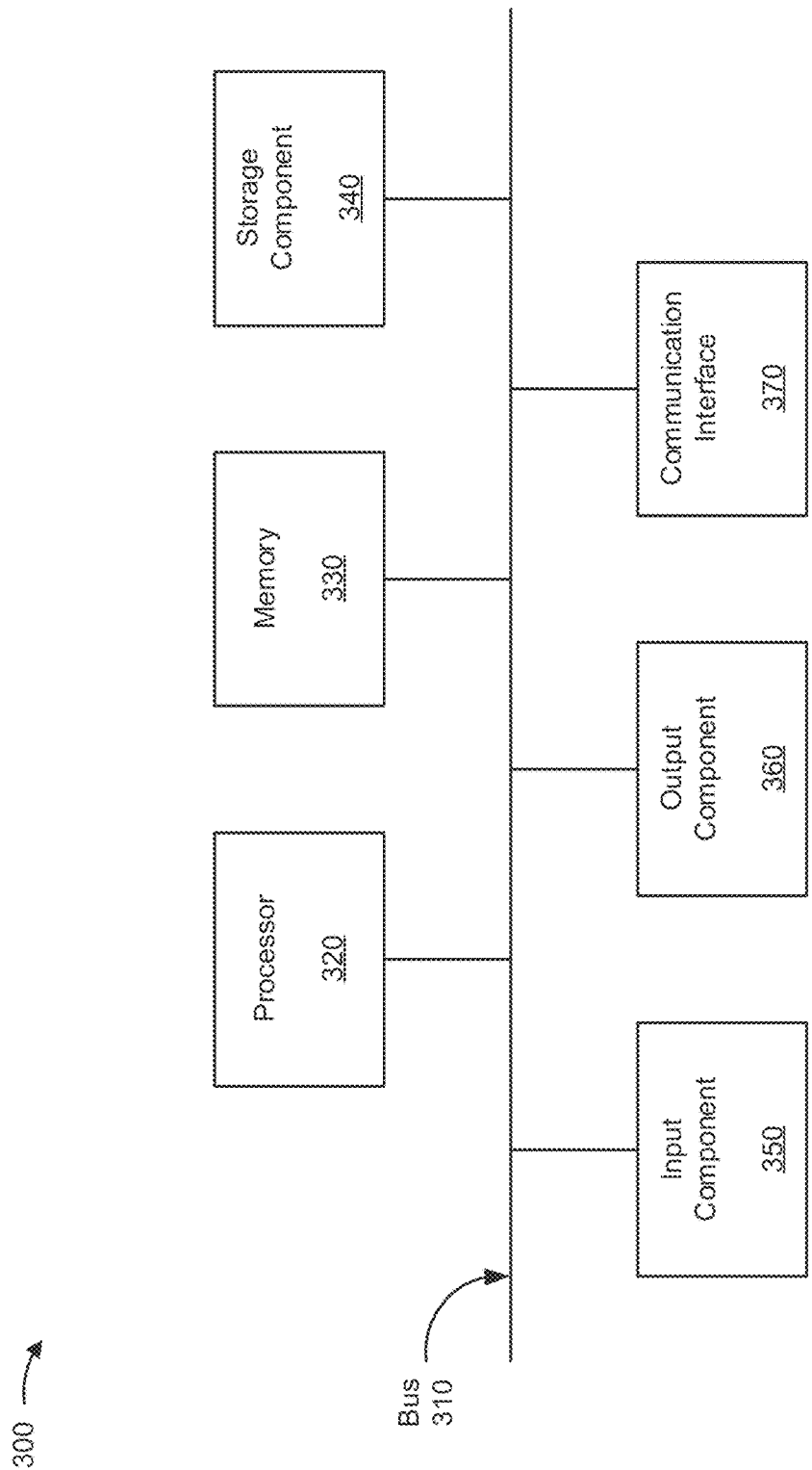
FIG. 3 is a diagram of example components of one or more devices of FIG. 2.

FIG. 3 is a diagram of example components of a device 300. Device 300 may correspond to user device 205, AM server 210, analytics platform 215, and/or computing resource 222. In some implementations, user device 205, AM server 210, analytics platform 215, and/or computing resource 222 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 includes a processor (e.g., a central processing unit (CPU), a graphics processing unit (GPU), and/or an accelerated processing unit (APU)), a microprocessor, a microcontroller, and/or any processing component (e.g., a field-programmable gate array (FPGA) and/or an application-specific integrated circuit (ASIC)) that interprets and/or executes instructions. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
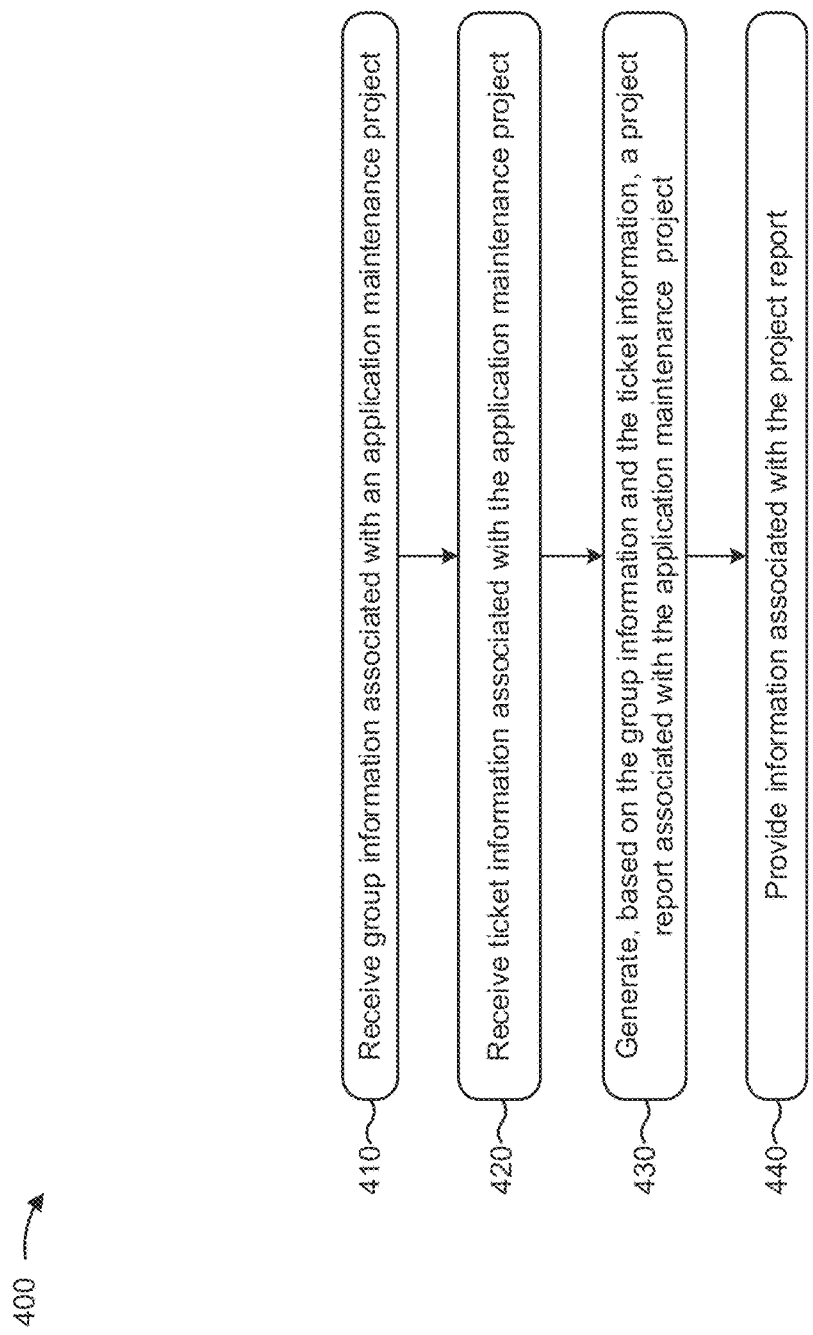
FIG. 4 is a flow chart of an example process for generating a project report based on group information, associated with an application maintenance project, and ticket information associated with the application maintenance project.

FIG. 4 is a flow chart of an example process 400 for generating a project report based on group information, associated with an application maintenance project, and ticket information associated with the application maintenance project. In some implementations, one or more process blocks of FIG. 4 may be performed by analytics platform 215. In some implementations, one or more process blocks of FIG. 4 may be performed by another device or a group of devices separate from or including analytics platform 215, such as user device 205 and/or AM server 210.

As shown in FIG. 4, process 400 may include receiving group information associated with an application maintenance project (block 410). For example, analytics platform 215 may receive the group information associated with the application maintenance project. In some implementations, analytics platform 215 may receive the group information from user device 205 and/or AM server 210.

The application maintenance project may include performance of application maintenance for one or more applications (e.g., software applications). In some implementations, the application maintenance project may be associated with one or more applications and/or one or more versions of the one or more applications. Additionally, or alternatively, a group of personnel (e.g., one or more individuals) may be assigned to perform application maintenance for the one or more applications.

The group information may include information associated with one or more groups of personnel associated with performing application maintenance. In some implementations, the group information may include shift information. The shift information may include information associated with one or more shifts of the group during which the application maintenance project is to be performed. For example, the shift information may include a start time associated with a shift, an end time associated with the shift, a target utilization rate associated with the shift (e.g., a desired percentage of time on a shift that personnel will spend performing application maintenance), a time zone difference (e.g., between a time zone of a location of the group and a time zone of a location of a server associated with the application), an amount of weekend resources (e.g., a number of individuals on the shift who perform application maintenance during weekends, an amount of computing resources available during the weekends), or the like.

As an example, FIG. 5A shows a user interface via which a user may provide input associated with the shift information. For example, analytics platform 215 may cause user device 205 to display the user interface to a user and to prompt the user to input the shift information. As shown in FIG. 5A, the user interface may obtain and/or display the start time and the end time for a shift in hours and minutes. As further shown in FIG. 5A, the user interface may obtain and/or display the target utilization (e.g., as a percentage indicating a maximum utilization of a full time equivalent (FTE) of an individual performing application maintenance). As further shown in FIG. 5A, the user interface may obtain and/or display the time zone difference (e.g., as a positive or negative value indicating a number of hours to convert from the group time zone to the server time zone). As further shown in FIG. 5A, the user interface may obtain and/or display the amount of weekend resources (e.g., a number of resources available for weekend support, such as an FTE count of individuals available to provide support on a weekend). In some implementations, the group information may include shift information for multiple shifts. For example, as shown in FIG. 5A, the user interface may obtain and/or display information associated with two different shifts (shown as "Shift A" and "Shift B").

In some implementations, the group information may include personnel information. The personnel information may include, for example, information that identifies attributes and/or characteristics of the one or more individuals associated with the group. As a particular example, the group information may include information that identifies an expertise level (e.g., an experience level, a proficiency level) among a set of expertise levels, a job title (e.g., a position or a designation) among a set of job titles of the one or more individuals, or the like. As another example, the group information may include information that identifies a cost associated with each expertise level and/or job title. As yet another example, the group information may include information that identifies a relative effort associated with the one or more expertise levels and/or job titles (e.g., an average number of hours and/or an amount of computing resources needed by a particular individual to resolve a ticket).

As an example, FIG. 5B shows a user interface via which a user may provide input associated with the personnel information. As shown in FIG. 5B, the user interface may obtain and/or display information associated with a set of expertise levels (e.g., "Level 0", "Level 1", "Level 2", "Level 3", and "Level 4). As further shown in FIG. 5B, the user interface may obtain and/or display information associated with a set of job titles (shown by "Designation"), such as Associate Software Engineer (ASE), Software Engineer (SE), Senior Software Engineer (SSE), Team Leader (TL), Associate Manager (AM), or Manager (M). Notably, the expertise levels and designations described herein are examples and may differ (e.g., from organization to organization). As further shown in FIG. 5B, the user interface may obtain and/or display information that identifies a cost (shown by "Cost/Hr ($)") associated with each job title. As further shown in FIG. 5B, the user interface may obtain and/or display information that identifies relative efforts associated with each expertise level. For example, if an expertise level 4 resource requires an average of 1 hour to resolve an issue (e.g., a ticket) and an expertise level 3 resource requires 10% longer than the expertise level 4 resource to resolve the same issue, then the user may enter a 1.0 under Level 4 and a 1.1 under Level 3.

In some implementations, analytics platform 215 may determine personnel information associated with each shift identified in the group information. For example, as shown in FIG. 5B, the user interface may obtain and/or display personnel information for two different shifts (shown as "Shift A" and "Shift B") and the personnel information may differ from shift to shift. In this way, the personnel information may include information that identifies a number of individuals who have a particular combination of shift level, job title, expertise level, or the like. For example, as shown in FIG. 5B, the user interface may obtain and/or display an FTE count of "4" for SSE's working in Shift A with an expertise level of 3.

In some implementations, analytics platform 215 may receive the group information from user device 205 (e.g., based on user input). Additionally, or alternatively, analytics platform 215 may receive the group information from AM server 210 (e.g., when AM server 210 stores the group information). In some implementations, the group information may be default group information. For example, the group information may be defined with particular initial values that the user may edit as desired before providing the group information to analytics platform 215.

In some implementations, analytics platform 215 may determine the group information based on a prediction. For example, analytics platform 215 may predict, based on historical group information (e.g., associated with the application, associated with another application), the group information associated with the application maintenance project. Here, analytics platform 215 may receive historical group information, associated with one or more applications, may provide the historical group information into a predictive model, and may receive, as an output of the predictive model, the group information associated with the application maintenance project.

Returning to FIG. 4, process 400 may include receiving ticket information associated with the application maintenance project (block 420). For example, analytics platform 215 may receive the ticket information associated with the application maintenance project. In some implementations, analytics platform 215 may receive the ticket information from user device 205 and/or AM server 210.

The ticket information may include information associated with tickets based on which application maintenance, associated with the application, is to be performed. For example, the ticket information may include inflow information associated with tickets that may be processed during application maintenance, backlog information associated with an existing backlog of tickets (i.e., unresolved tickets at the start of the application maintenance project), pattern information associated with a pattern identified based on receipt of the tickets, monitoring information associated with resources needed to monitor and/or manage the application maintenance project, or the like.

As an example, FIG. 5C shows a user interface via which a user may provide input associated with the ticket information. As shown in FIG. 5C, the user interface may obtain and/or display ticket inflow information, such as a monthly ticket inflow (e.g., an average or actual monthly count of tickets submitted), a percentage of the inflow that occurs on weekdays, a percentage of the inflow that occurs on weekends, and/or backlog information associated with an existing backlog of tickets. As further shown in FIG. 5C, the user interface may obtain and/or display pattern information such as a ticket inflow pattern. For example, the ticket inflow pattern may include a percentage of tickets arriving within each of 8 three-hour slots over the course of a 24 hour day, and may be further broken out between weekdays and weekends. As further shown in FIG. 5C, the user interface may obtain and/or display monthly efforts information (e.g., additional efforts spent on the project), such as monitoring information (e.g., a number of hours spent monitoring the project) and/or enhancements information (e.g., a number of hours spent on enhancements to the project).

In some implementations, the ticket information may include ticket type information associated with one or more types of tickets that may be received. For example, ticket type information, associated with a ticket type (e.g., an incident ticket, a problem ticket, or a charge ticket), may include information that identifies a priority associated with the ticket type (e.g., 1, 2, 3, or 4; low, medium, or high; etc.), a percentage of the ticket inflow that includes tickets of the ticket type, an amount of effort associated with resolving a ticket of the ticket type, a skills preference (e.g., an expertise level or a job title) for an individual to be assigned to resolve a ticket of the ticket type, an indication of whether on-call support is desired for a ticket of the ticket type, a service window type associated with the ticket type (e.g., weekday support, weekday and weekend support, or weekday and partial-weekend support), a service level agreement target for resolving a ticket of the ticket type, a service window (e.g., a start time and end time) during which a ticket of the ticket type is to be resolved, time zone information corresponding to the service window, or the like.

Figure 5D:
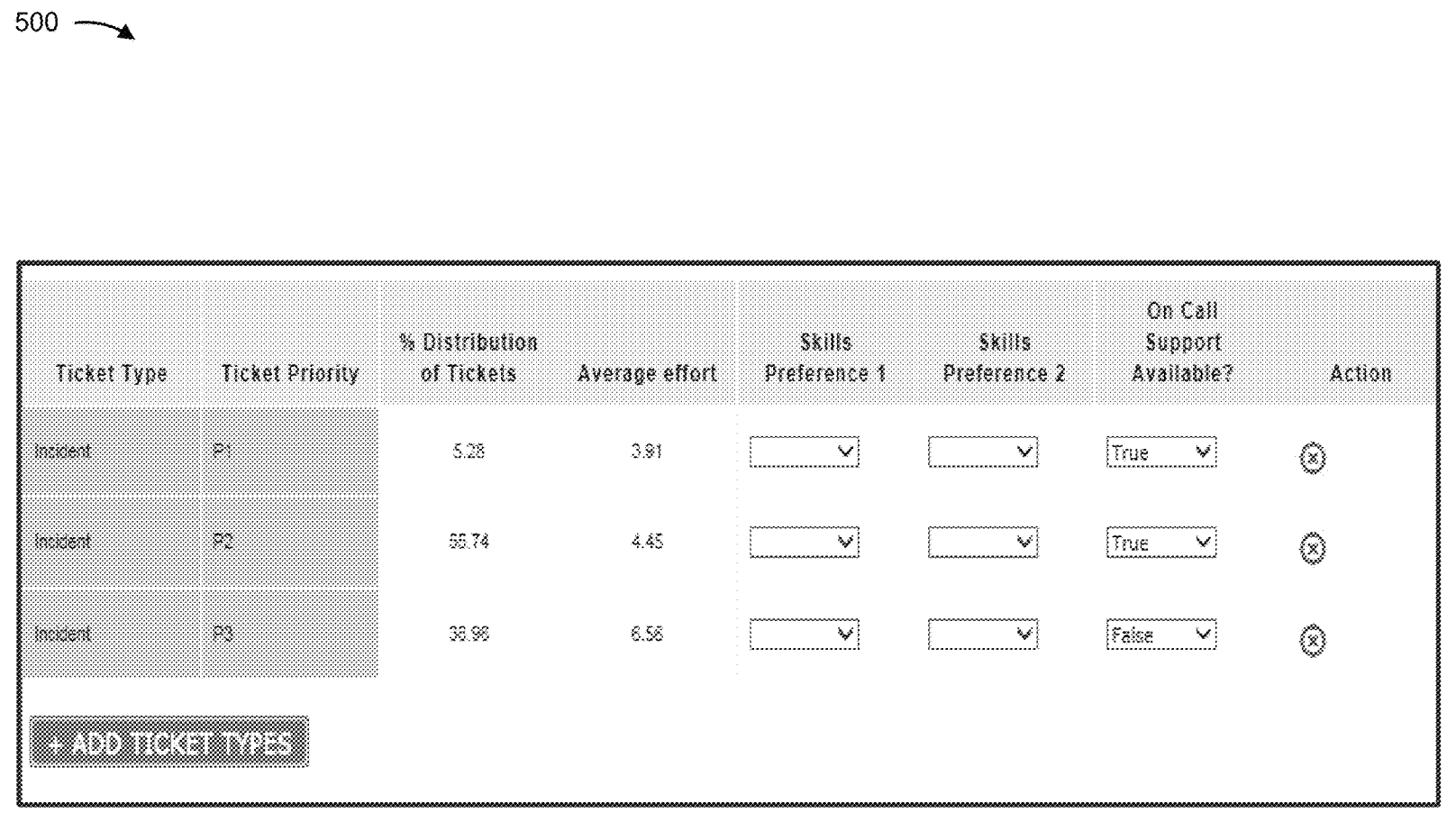

As an example, FIG. 5D shows a user interface via which a user may provide input associated with the ticket type information. As shown in FIG. 5D, the user interface may obtain and/or display a ticket type (e.g., "Incident"), ticket priority information (e.g., priority level "P1", "P2", "P3"), and/or a percentage distribution of tickets (e.g., a percentage of ticket volume for each priority level). As further shown in FIG. 5D, the user interface may obtain and/or display an average effort for each ticket (e.g., an average number of hours or resources to resolve a ticket for each combination of ticket type and/or priority level). As further shown in FIG. 5D, the user interface may obtain and/or display a first and second skill preference for each ticket type and/or priority level. As further shown in FIG. 5D, the user interface may obtain and/or display an indicator (e.g., "True" or "False") of whether on call support is available for each ticket type and/or priority level.

As another example, FIG. 5E shows a user interface via which a user may provide additional input associated with the ticket type information. As shown in FIG. 5E, the user interface may obtain and/or display a service window type for each ticket type and/or priority level. For example, a user may select "X7" to indicate 7 days of support per week, "X6" to indication 6 days of support (e.g., Monday-Saturday), "X5" to indicate 5 days of support (e.g., Monday-Friday), or the like. As further shown in FIG. 5E, the user interface may obtain and/or display a SLA target representing a target number of hours for resolving the ticket. As further shown in FIG. 5E, the user interface may obtain and/or display a service window start and end time (e.g., in hours and minutes) defining a time period during which service is measured (e.g., during which time is counted towards measuring SLA target resolution and/or compliance). As further shown in FIG. 5E, the user interface may obtain and/or display a time zone difference (e.g., a positive or negative value indicating a number of hours required to convert from the service window time zone to the server time zone).

In some implementations, analytics platform 215 may receive the ticket information from user device 205 (e.g., based on user input). Additionally, or alternatively, analytics platform 215 may receive the ticket information from AM server 210 (e.g., when AM server 210 stores the ticket information).

In some implementations, analytics platform 215 may determine the ticket information based on a prediction. For example, analytics platform 215 may predict, based on historical ticket information (e.g., associated with the application, associated with another application), the ticket information associated with the application maintenance project. Here, analytics platform 215 may receive historical ticket information, associated with one or more applications, may provide the historical ticket information into a predictive model, and may receive, as an output of the predictive model, the ticket information associated with the application maintenance project.

In some implementations, the ticket information may be default ticket information. For example, the ticket information may be defined with particular initial values that the user may edit as desired before providing the ticket information to analytics platform 215.

Returning to FIG. 4, process 400 may include generating, based on the group information and the ticket information, a project report associated with the application maintenance project (block 430). For example, analytics platform 215 may generate the project report associated with the application maintenance project. In some implementations, analytics platform 215 may generate the project report when analytics platform 215 receives the group information and the ticket information.

The project report may include information that identifies one or more performance metrics, associated with the application maintenance project, determined based on the group information and the ticket information. For example, the project report may include information associated with a total number of tickets expected to be received during a time period associated with the application maintenance project, a backlog of tickets expected at a particular time (e.g., the end of the time period or at an intermediate time) associated with the application maintenance project, a SLA compliance rate expected at the particular time associated with the application maintenance project, a utilization rate expected at the particular time associated with the application maintenance project, a total number of tickets expected to be resolved at the particular time associated with the application maintenance project, or the like.

In some implementations, analytics platform 215 may generate the project report based on the group information and/or the ticket information. For example, analytics platform 215 may receive the group information and/or ticket information, as described above. Analytics platform 215 may then determine (e.g., based on user input, automatically, or based on a default configuration) a time period associated with the application maintenance project (i.e., a time period for which performance of application maintenance is to be simulated). Here, analytics platform 215 may execute a simulation of the performance of the application maintenance project based on the group information (e.g., the shift information and/or the personnel information) and the ticket information in order to determine a result of the simulated performance of the application maintenance (herein referred to as a simulation result).

In some implementations, executing the simulation of the performance of the application maintenance project may include use of a virtual clock based simulation engine that creates a ticket queue based on (e.g., varying) ticket inflow rates during a simulated day, where a variance of the ticket inflow rates is meant to simulate actual ticket inflow associated with the application maintenance project. The simulation engine may consider (e.g., based on the ticket information) weekday and/or weekend ticket inflows and resource availability. Here, the simulation engine may be capable of simulating (e.g., based on the group information) on call support, skill based ticket allocation, different geography and/or time zone coverage of resources, or the like. The simulation engine may also check (e.g., based on the ticket information) criticality of tickets and prioritize allocation and/or resolution of the tickets accordingly. Further, the simulation engine may consider the impact of productivity based on skills of resources identified in the group information. In other words, analytics platform 215 may predict metrics associated with the performance of application maintenance based on the group information and/or the ticket information.

As an example, analytics platform 215 may use the group information and the ticket information as input to the simulation (e.g., a predictive model associated with the application maintenance project). Here, analytics platform 215 may execute the simulation by, for example, computing (e.g., based on the group information and the ticket information) predicted results of the application maintenance project, such as a number of tickets predicted to be resolved during the time period, a ticket backlog during the time period, an amount of time to resolve a ticket (e.g., on an overall basis, on a per ticket priority basis, etc.), or the like. Here, an output of the simulation may include one or more of the predicted results, one or more performance metrics (e.g., a SLA compliance rate) associated with the one or more predicted results, an indication whether a predicted result and/or a performance metric satisfies a SLA, or the like.

Figure 5F:
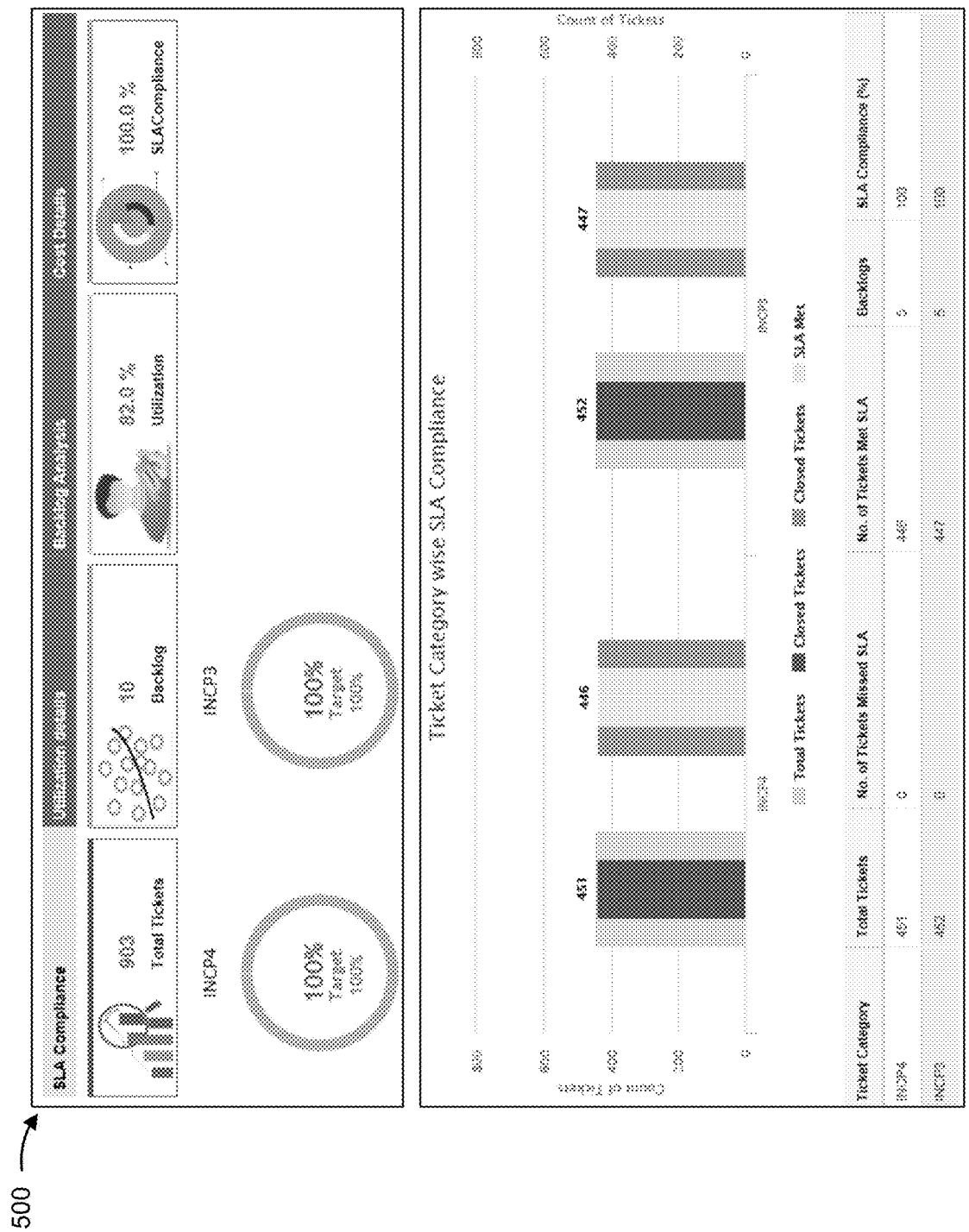

As an example, FIG. 5F shows a user interface via which information associated with the project report, including a SLA compliance portion, may be provided. As shown in FIG. 5F, the SLA compliance portion may include a pictorial representation (e.g., a donut chart) of overall SLA compliance (e.g., for each of multiple ticket priority levels), including an indication of the percentage of a target compliance (e.g., a target compliance that has been selected by a user). As further shown in FIG. 5F, the SLA compliance portion may include a visual representation (e.g., a vertical bar chart) of the number of tickets closed versus the total number of tickets, and may be further separated (e.g., into multiple charts) by a ticket category (e.g., ticket priority level). Similarly, the SLA compliance portion may include a visual representation (e.g., a vertical bar chart) of the number of tickets that have met SLA requirements out of the closed tickets, and may be further separated (e.g., into multiple charts) by a ticket category (e.g., ticket priority level). As further shown in FIG. 5F, the SLA compliance portion may include in-depth information like a total number of tickets, a number of tickets that have missed SLA compliance, a number of tickets that have met SLA compliance, a number of tickets that have resulted in backlogs, and/or an overall SLA compliance percentage. The in-depth information may be further separated by a ticket category (e.g., priority level).

Figure 5G:

As another example, FIG. 5G shows a user interface via which information associated with the project report, including a utilization details portion, may be provided. As shown in FIG. 5G, the utilization details portion may include a pictorial representation (e.g., a pie chart) showing an average utilization level of a group during the application maintenance project. As further shown in FIG. 5G, the utilization details portion may include a pictorial representation (e.g., a donut chart) of an effort classification showing an on-call effort percentage and/or a shift effort percentage. As further shown in FIG. 5G, the utilization details portion may include a pictorial representation (e.g., a horizontal bar chart) of a shift wise utilization to show the utilization percentage of a shift. As further shown in FIG. 5G, the utilization details portion may include a graphical representation of a resource wise utilization percentage.

Figure 5H:
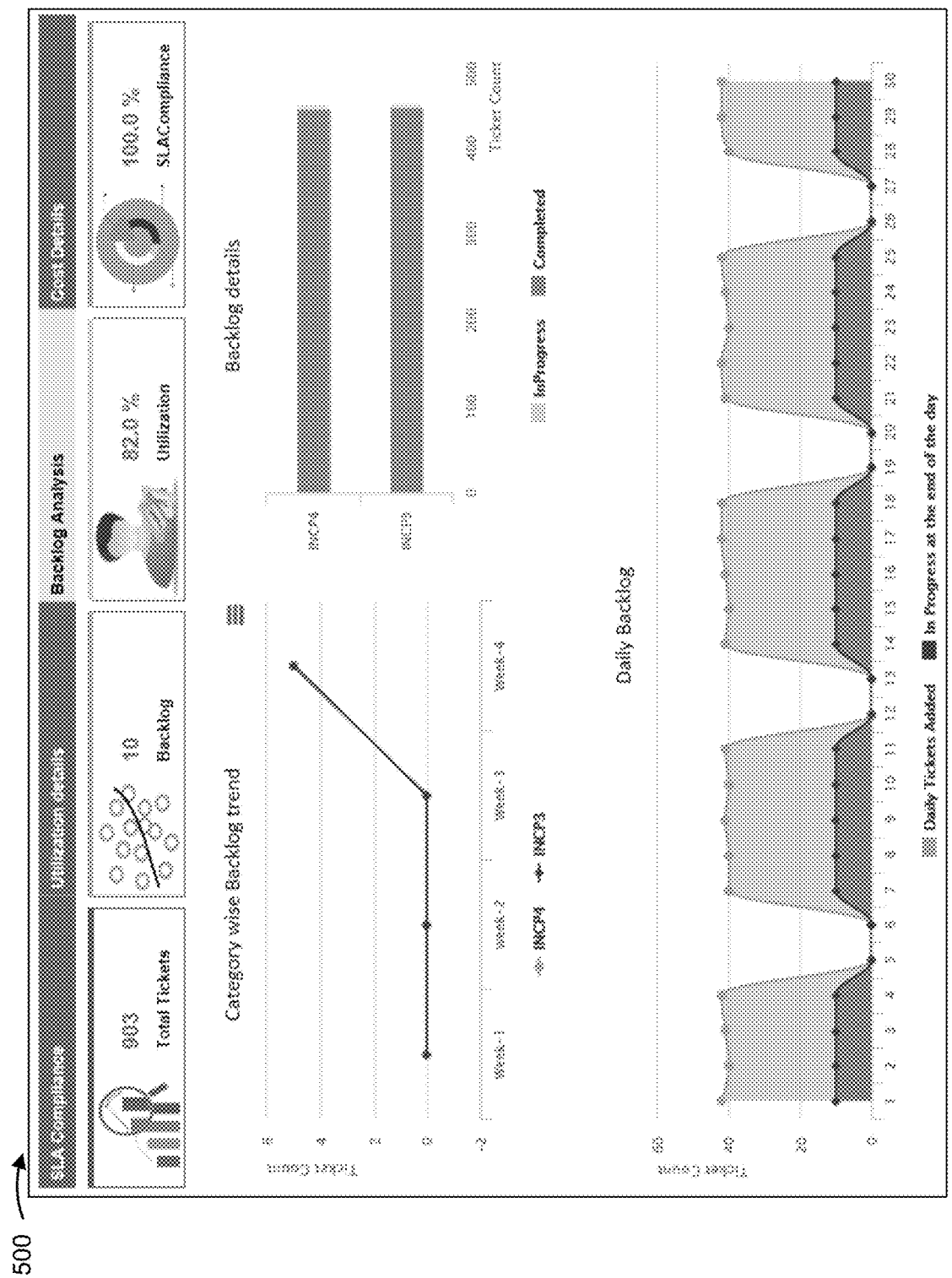

As another example, FIG. 5H shows a user interface via which information associated with the project report, including a backlog analysis portion, may be provided. As shown in FIG. 5H, the backlog analysis portion may include a pictorial representation (e.g., a line graph) of a category wise backlog trend (e.g., a backlog ticket count plotted over a course of weeks for a ticket category, such as a ticket priority level). As further shown in FIG. 5H, the backlog analysis portion may include a pictorial representation (e.g., a horizontal bar chart) of backlog details, such as a total ticket count by category and status (e.g., in progress or completed). As further shown in FIG. 5H, the backlog analysis portion may include a daily backlog chart of a total count of daily tickets added, and a total count of tickets in progress at the end of the day.

As another example, FIG. 5I shows a user interface via which information associated with the project report, including a cost details portion, may be provided. As shown in FIG. 5I, the cost details portion may include a pictorial representation (e.g., a vertical bar chart) of hours spent and costs involved, separated by job title (e.g., ASE, SE, TL, and AM). As further shown in FIG. 5I, the cost details portion may include a pictorial representation (e.g., a pie chart) of cost distribution by level.

Returning to FIG. 4, process 400 may include providing information associated with the project report (block 440). For example, analytics platform 215 may provide the information associated with the project report. In some implementations, analytics platform 215 may provide the information associated with the project report after analytics platform 215 generates the project report.

In some implementations, analytics platform 215 may provide the information associated with the project report such that the information associated with the project report may be provided for display to a user (e.g., to allow the user to evaluate whether the shift and personnel, associated with the group information, is sufficient to perform application maintenance in accordance with the ticket information). For example, analytics platform 215 may provide the information via one or more user interfaces described above in connection with FIGS. 5A-5I.

Additionally, or alternatively, analytics platform 215 may provide the information associated with the project report in the form of a visual process flow. Here, the visual process flow may include one or more graphical representations of the simulation process, such as one or more interactive diagrams associated with simulating the performance of the application maintenance.

Additionally, or alternatively, analytics platform 215 may provide the information associated with the project report in order to cause an action to be automatically performed. For example, analytics platform 215 may provide the information associated with the project report in order to cause a notification, a message, or a warning to be sent to an individual associated with the application maintenance project. Here, the notification and/or the message may indicate whether the shift and personnel, associated with the group information, is sufficient to perform application maintenance in accordance with the ticket information.

As another example, analytics platform 215 may provide the information associated with the project report to automatically schedule a review of the application maintenance project by an individual (e.g., when the shift and personnel, associated with the group information, is not sufficient to perform application maintenance in accordance with the ticket information).

As another example, analytics platform 215 may provide the information associated with the project report to automatically cause resources, (e.g., personnel, computing resources) associated with the group, to be scheduled in order to perform application maintenance in accordance with the application maintenance project (e.g., when the group, associated with the group information, is sufficient to perform application maintenance for the application in accordance with a SLA). Here, with respect to scheduling a resource (e.g., personnel), analytics platform 215 may automatically add an event to a calendar and/or automatically update the calendar and/or a schedule (e.g., associated with scheduling software) for the group.

As another example, analytics platform 215 may provide the information associated with the project report to automatically generate a recommendation to acquire a new resource (e.g., hire additional personnel, acquire additional computers). For example, analytics platform 215 may automatically generate a job posting based on the required skills/expertise, and provide the job posting to a supervisor and/or post the job posting to a jobs website.

As another example, analytics platform 215 may provide the information associated with the project report to automatically update an expected finish time of the project, based on the schedule, and provide information associated with the updated expected finish time to a supervisor and/or post the information for view by others (e.g., by posting the information to a company intranet).

In this way, performance of application maintenance may be improved by, for example, allowing for efficient and effective allocation of resources (e.g., computing resources or personnel) for performing application maintenance. Here, overall performance and/or operation of the application may be improved due to the efficient and/or effective allocation of such resources, thereby allowing system software and hardware (e.g., associated with executing and/or hosting the application) to function more efficiently and/or effectively.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Additionally, as indicated above, FIGS. 5A-5I are provided merely as examples. Other examples are possible and may differ from what was described with regard to FIGS. 5A-5I.

FIG. 6 is a flow chart of an example process 600 for generating a modified project report, associated with an application maintenance project, and comparing the modified project report to a project report associated with the application maintenance project. In some implementations, one or more process blocks of FIG. 6 may be performed by analytics platform 215. In some implementations, one or more process blocks of FIG. 6 may be performed by another device or a group of devices separate from or including analytics platform 215, such as user device 205 and/or AM server 210.

As shown in FIG. 6, process 600 may include receiving modified group information, associated with an application maintenance project, or modified ticket information associated with the application maintenance project (block 610). For example, analytics platform 215 may receive the modified group information and/or the modified ticket information (sometimes referred to collectively as modified information) associated with the application maintenance project. In some implementations, analytics platform 215 may receive the modified group information and/or the modified ticket information from user device 205 and/or AM server 210. Additionally, or alternatively, analytics platform 215 may generate the modified group information and/or the modified ticket information, as described below.

The modified group information or the modified ticket information may include a modified version of the group information associated with the application maintenance project, or a modified version of the ticket information associated with the application maintenance project, respectively. For example, the group information (e.g., as described above in connection with example process 400) may include group information associated with current (i.e., existing, as-is) shifts and/or personnel associated with performing application maintenance, while modified group information, associated with the application maintenance project, may include group information that has been modified to reflect a change (e.g., an expected change, a possible change, or a desired change) to one or more shifts and/or personnel associated with performing the application maintenance. As another example, the ticket information (e.g., as described above in connection with example process 400) may include ticket information associated with current (i.e., existing, as-is) inflow of tickets and/or ticket type information, while modified ticket information, associated with the application maintenance project, may include ticket information that has been modified to reflect a change (e.g., an expected change, a possible change, or a desired change) in the ticket inflow and/or the ticket type information associated with performing the application maintenance.

Figure 7A:
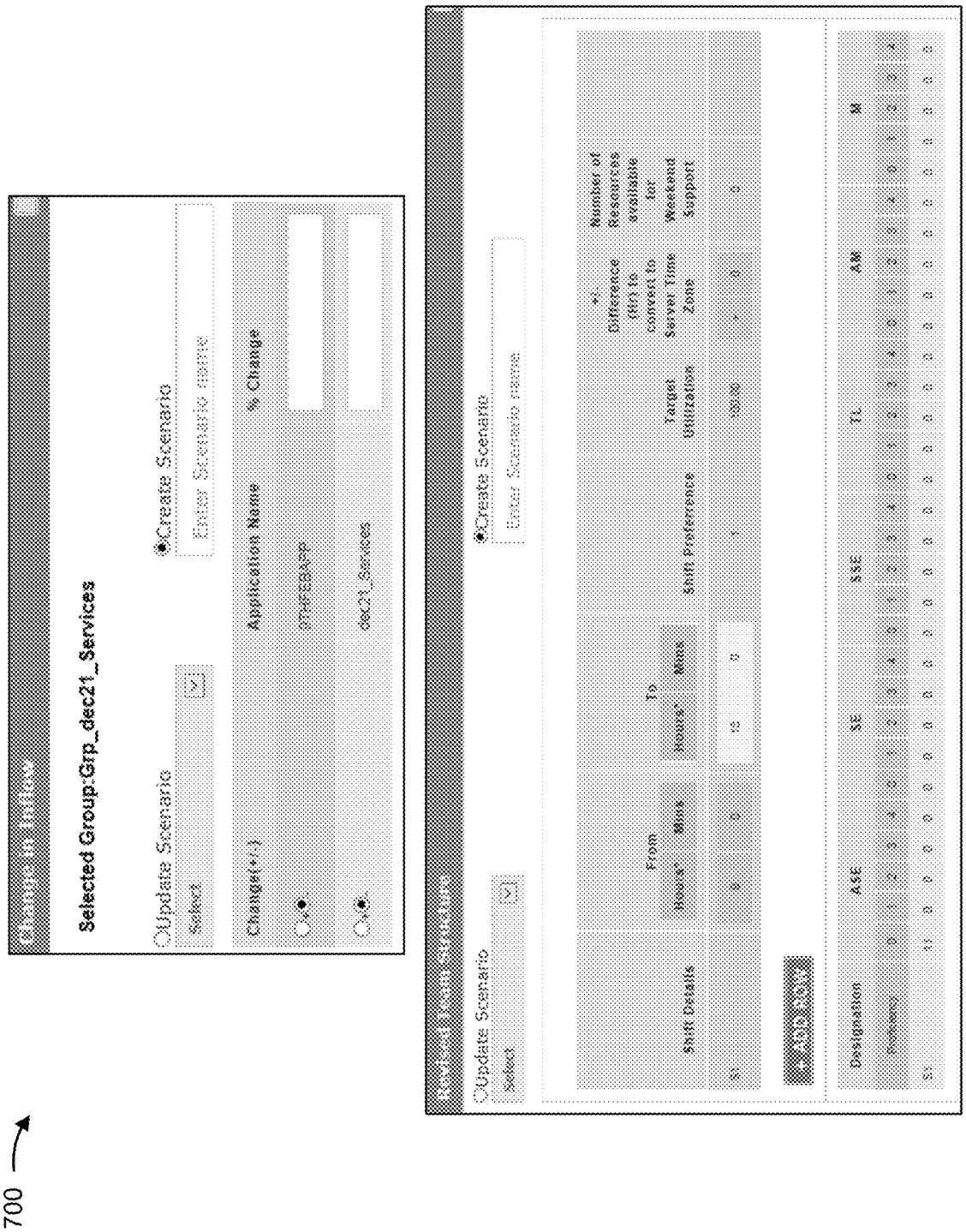

As an example, FIG. 7A shows a user interfaces via which a user may provide modified ticket inflow and/or modified personnel information. As shown in FIG. 7A, the user interfaces provide a means by which a user can increase or decrease the ticket inflow by a designated percentage. For example, if the user desires to increase the ticket inflow from 100 to 150, the user may select the "+" under "Change (+/−)" to increase the ticket inflow, and may enter 50% under "% Change". As further shown in FIG. 7A, the user interfaces provide a means by which a user can make changes to personnel information (e.g., FTE count), move resources among different shifts, or the like.

Figure 7B:
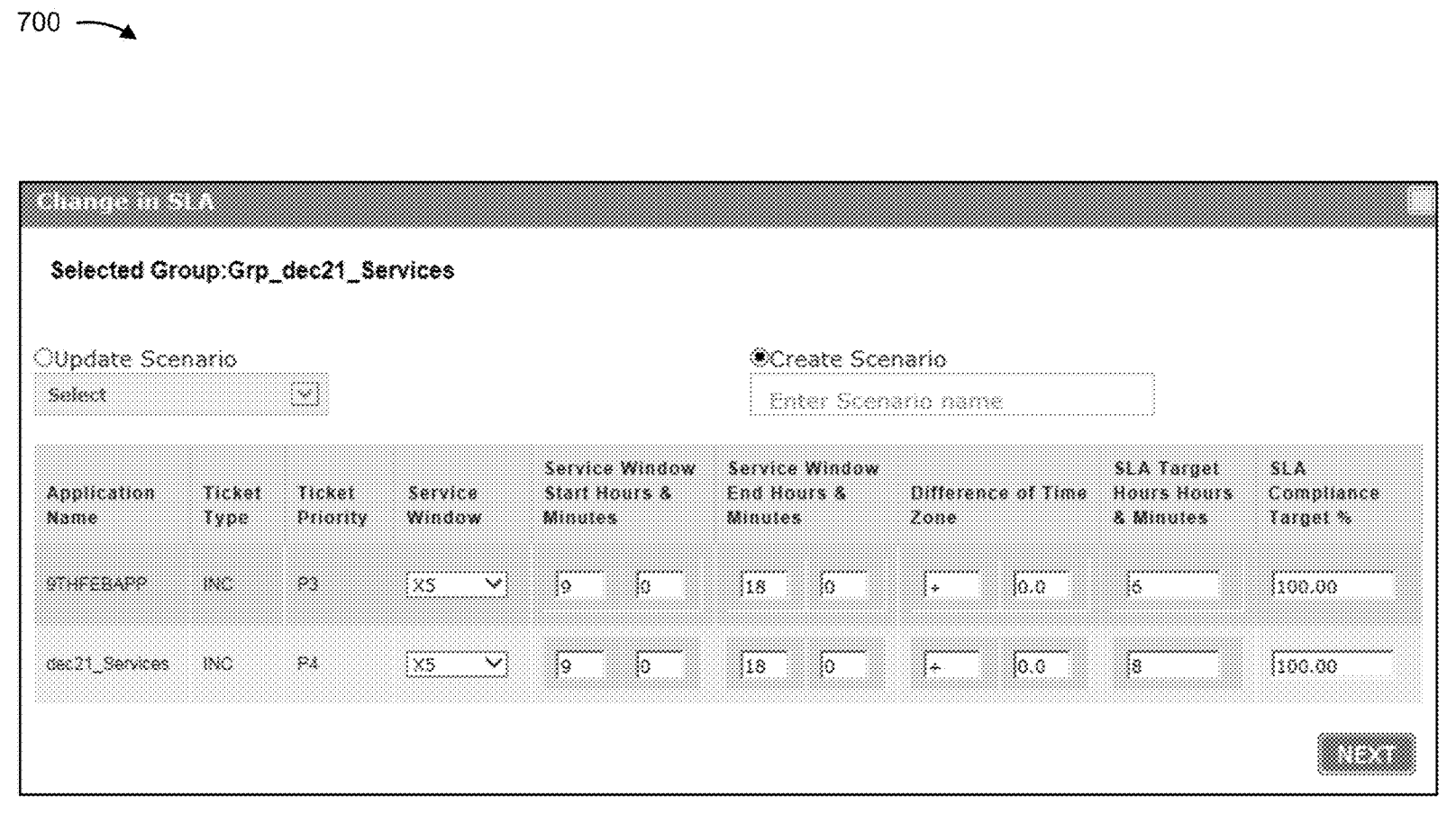

As another example, FIG. 7B shows a user interface via which a user may provide modified SLA information. As shown in FIG. 7B, the user interface provides a means by which a user can enter or change (e.g., per ticket type and/or ticket priority) service window information, time zone information, SLA target information, or the like. For example, the user may enter and/or change information similar to the manner described with regard to FIG. 5E. In this way, possible modifications to an existing SLA may be investigated in order to determine whether performance of application maintenance, in accordance with a modified SLA, is possible.

Figure 7C:

As another example, FIG. 7C shows user interfaces via which a user may provide modified productivity and modified existing backlog information. As shown in FIG. 7C, the user interfaces provide a means by which a user can indicate a change in productivity. For example, if the user desires to improve productivity by reducing effort from 4 hours to 3 hours, the user may enter 25% under "% Productivity Improvement Impact" to indicate the reduction in effort. As further shown in FIG. 7C, the user interfaces provide a means by which the user can change the backlog count by entering a value under "New Backlog Count."

In some implementations, analytics platform 215 may determine the modified group information and/or the modified ticket information based on user input (e.g., via one or more user interfaces displayed via user device 205). Additionally, or alternatively, analytics platform 215 may determine the modified group information and/or the modified ticket information based on a prediction. For example, analytics platform 215 may predict (e.g., based on historical ticket inflow information) a future inflow of tickets, and may determine the modified ticket information based on the predicted future ticket inflow.

Additionally, or alternatively, analytics platform 215 may randomly determine the modified group information and/or the modified ticket information. For example, analytics platform 215 may randomly modify one or more items of group information and/or ticket information (e.g., such that analytics platform 215 may determine whether the modified group information and/or the modified ticket information allows for improved performance of application maintenance).

Additionally, or alternatively, analytics platform 215 may automatically determine the modified group information and/or the modified ticket information. For example, analytics platform 215 may (e.g., randomly, based on a default pattern, or the like) modify one or more items of group information and/or ticket information in order to generate an optimized project report. Here, the optimized project report may include a modified project report that is generated based on modified group information and/or modified ticket information that allows for optimized performance of application maintenance, improved performance of application maintenance, performance of application maintenance that satisfies a threshold level of performance and/or improvement, or the like. Here, analytics platform 215 may (e.g., automatically) generate the optimal project report by executing multiple iterations (e.g., generating multiple modified project reports using differently modified group information and/or ticket information), and identifying the optimized project report as a project report that indicates an optimal and/or improved performance of application maintenance.

In some implementations, analytics platform 215 may determine both modified group information and modified ticket information. Additionally, or alternatively, analytics platform 215 may determine modified group information only (e.g., when analytics platform 215 is to generate a modified project report associated with changing shifts and/or personnel while maintaining current ticket inflow and ticket types). Additionally, or alternatively, analytics platform 215 may determine modified ticket information only (e.g., when analytics platform 215 is to generate a modified project report associated with changing ticket inflow and/or ticket types while maintaining current shifts and personnel).

Returning to FIG. 6, process 600 may include generating, based on the modified group information and/or the modified ticket information, a modified project report associated with the application maintenance project (block 620). For example, analytics platform 215 may generate the modified project report associated with the application maintenance project. In some implementations, analytics platform 215 may generate the modified project report when analytics platform 215 receives the modified group information and/or the modified ticket information. In some implementations, the user may provide an indication that analytics platform 215 is to generate the modified project report.

The modified project report may include information that identifies one or more performance metrics associated with the application maintenance project after information (e.g., group information and/or ticket information) has been modified. Analytics platform 215 may generate the modified project report in a similar manner to that described above with regard to block 430 of FIG. 4. In other words, analytics platform 215 may simulate a performance of the application maintenance based on the modified group information and/or the modified ticket information in order to determine a modified result of simulating the performance of the application maintenance (herein referred to as a modified simulation result). For example, the modified project report may include information associated with a total number of tickets expected to be received during a time period associated with the application maintenance project, a backlog of tickets expected at a particular time (e.g., the end of the time period or at an intermediate time) associated with the application maintenance project, a SLA compliance rate expected at the particular time associated with the application maintenance project, a utilization rate expected at the particular time associated with the application maintenance project, a total number of tickets expected to be resolved at the particular time associated with the application maintenance project, or the like.

As further shown in FIG. 6, process 600 may include comparing the modified project report and a project report (block 630). For example, analytics platform 215 may compare the modified project report and the project report.

In some implementations, analytics platform 215 may compare one or more performance metrics, associated with the modified project report, and one or more performance metrics associated with the project report. For example, analytics platform 215 may compare total numbers of tickets expected to be received, backlogs of tickets, SLA compliance rates, and/or utilization rates. In some implementations, analytics platform 215 may determine a difference, associated with the one or more performance metrics, based on comparing the modified project report and the project report, such as a difference in a percentage of SLA compliance rates, a difference in percentage of utilization rates, a difference in backlog sizes, a difference in a number of tickets received or resolved, or the like.

In some implementations, analytics platform 215 may identify whether the modified project report indicates an improvement in the performance of application maintenance as compared to the project report (e.g., whether the modified project report indicates a higher SLA compliance rate than the project report, a higher utilization rate than the project report, or the like). In some implementations, the determination of whether the modified project report indicates an improvement may be based on scores associated with the modified project report and the project report, where analytics platform 215 may determine the scores based on the one or more performance metrics (e.g., a sum of scores associated with each performance metric, a weighted average of scores associated with each performance metric, or the like).

Figure 7D:
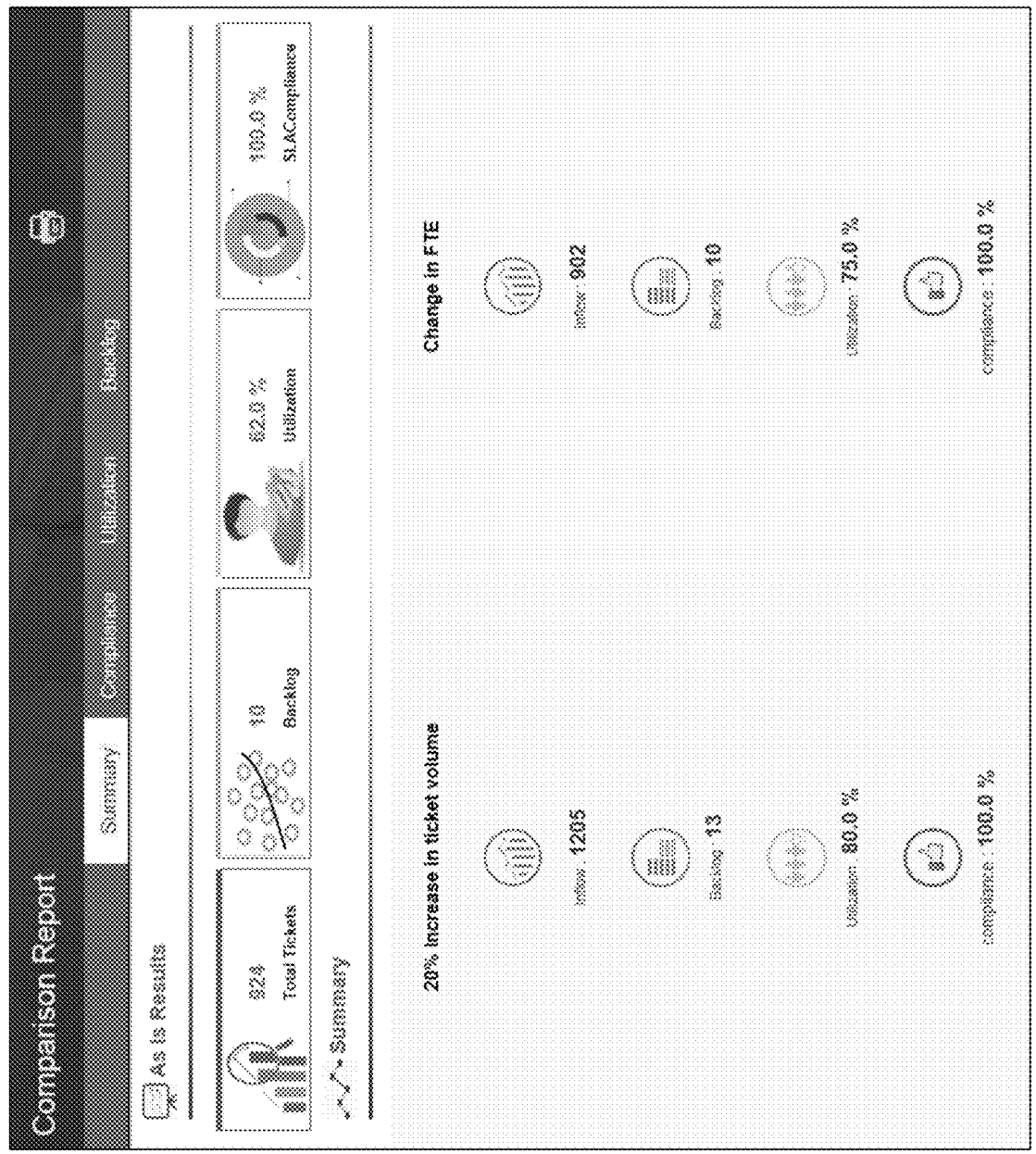

As an example, FIG. 7D shows a user interface via which a summary of changes to performance metrics may be provided. As shown in FIG. 7D, project report performance metrics (Total Tickets=924, Backlog=10, Utilization=62%, SLA Compliance=100%) may be provided (e.g., in a horizontal row) based on results of an initial (e.g., "as-is") analysis. As further shown in FIG. 7D, modified project report performance metrics may be provided (e.g., in a vertical tabular format) for comparison to the project report performance metrics. Multiple sets of modified project report performance metrics may be provided based on multiple modifications. For example, as further shown in FIG. 7D, a 20% increase in ticket volume may result in one set of modified project report performance metrics (Total Tickets=1205, Backlog=13, Utilization=80%, SLA Compliance=100%) and a change in FTE may result in another set of modified project report performance metrics (Total Tickets=902, Backlog=10, Utilization=75%, SLA Compliance=100%).

Figure 7E:
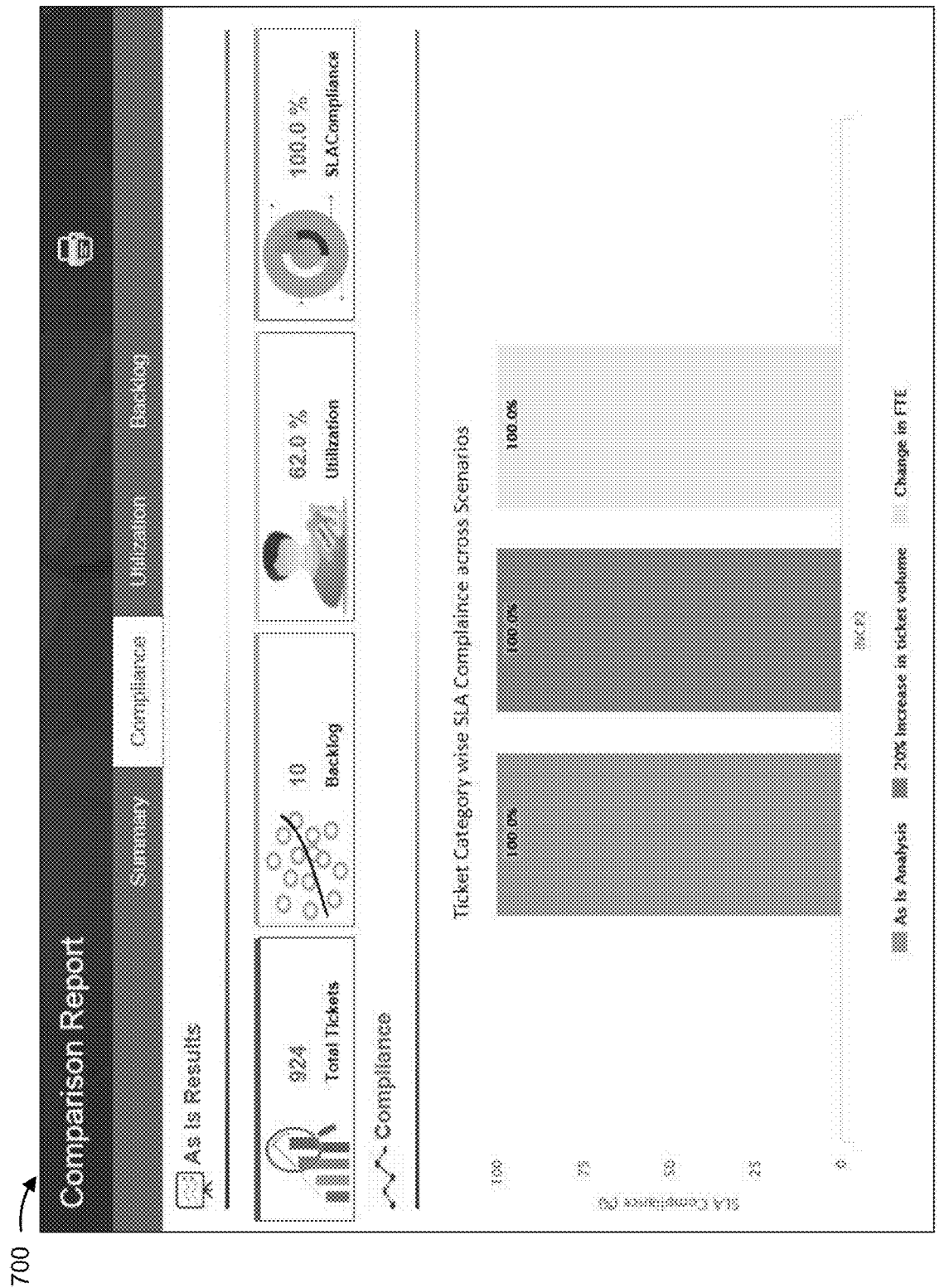

As another example, FIG. 7E shows a user interface via which a SLA compliance comparison may be provided. As shown in FIG. 7E, an overall SLA compliance percentage may be compared across multiple scenarios. As further shown in FIG. 7E, the user interface may include a pictorial representation (e.g., a vertical bar chart) of each scenario including, from the previous example, the SLA compliance percentage for the as-is scenario (100%), an SLA compliance percentage for a 20% increase in ticket volume (100%), and an SLA compliance percentage for a change in FTE (100%).

Figure 7F:
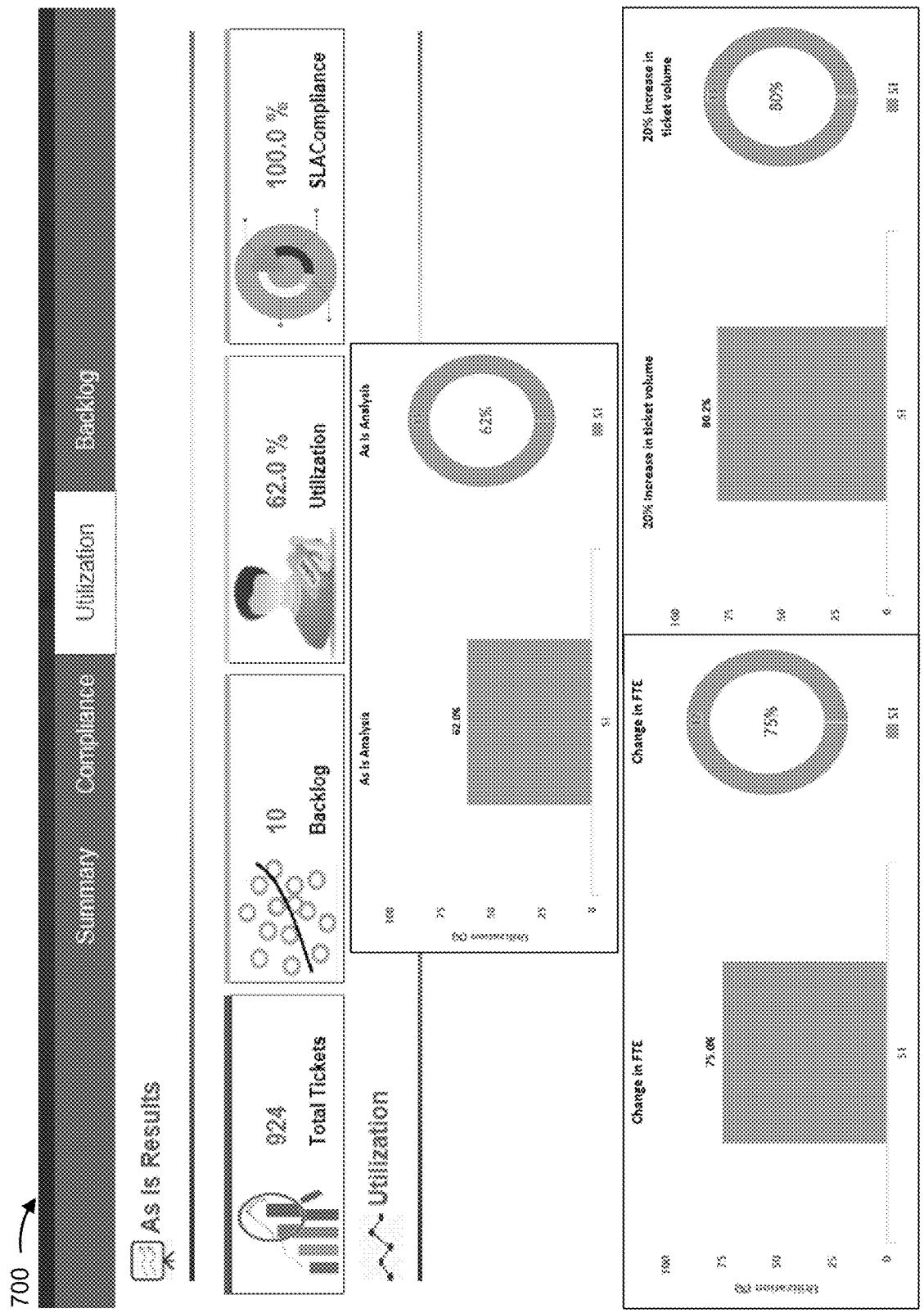

As another example, FIG. 7F shows a user interface via which a utilization comparison may be provided. As shown in FIG. 7F, an overall utilization may be compared across multiple scenarios. As further shown in FIG. 7F, the user interface may include a pictorial representation (e.g., a vertical bar chart and donut chart) of each scenario including, continuing the previous example, the utilization percentage for the as-is scenario (62%), the utilization percentage for a 20% increase in ticket volume (80%), and the utilization percentage for a change in FTE (75%).

Figure 7G:
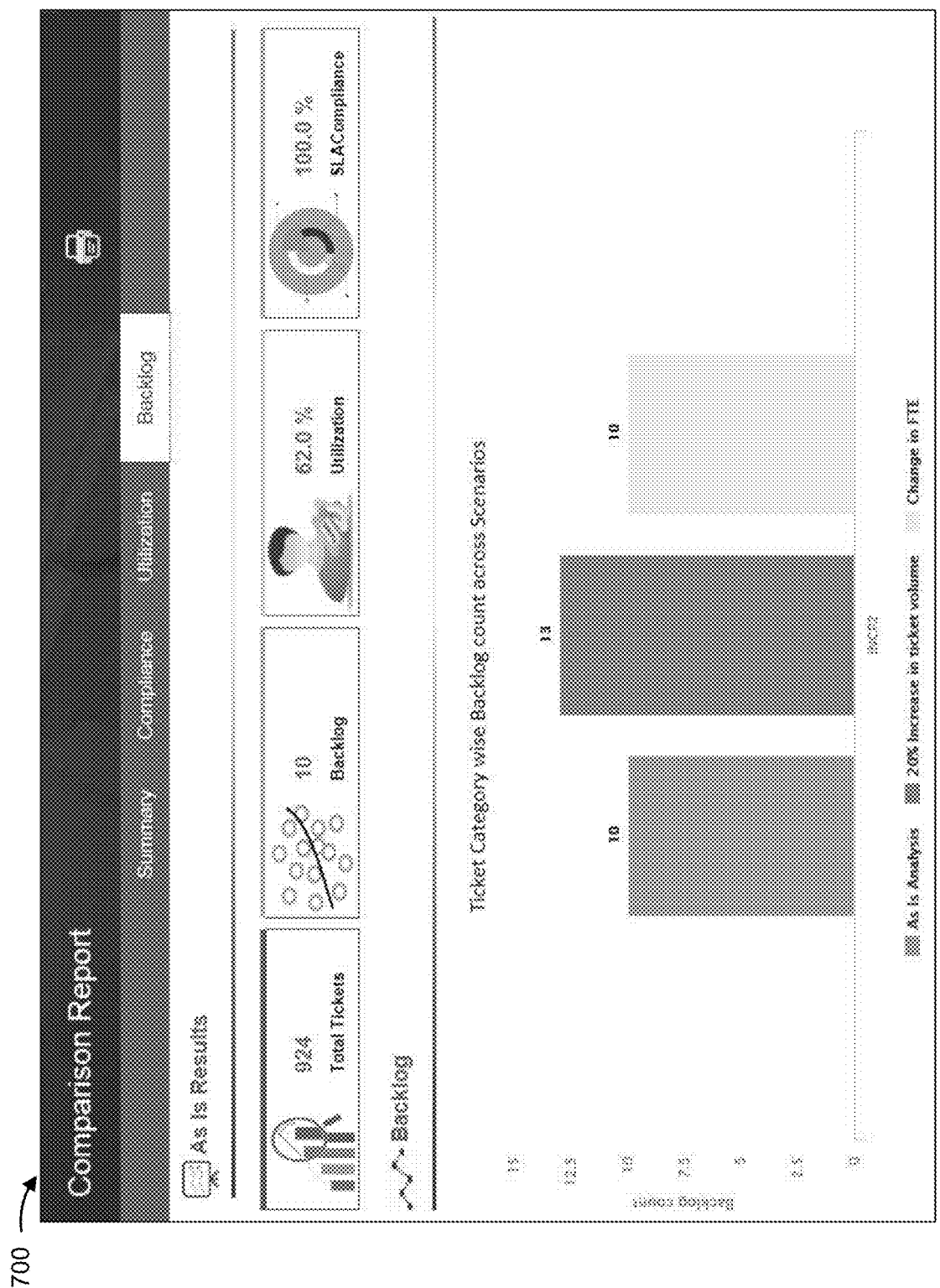

As another example, FIG. 7G shows a user interface via which a backlog comparison may be provided. As shown in FIG. 7G, a ticket category wise backlog count (e.g., backlog for tickets with a priority level of 2) may be compared across multiple scenarios. As further shown in FIG. 7G, the user interface may include a pictorial representation (e.g., a vertical bar chart) of each scenario including, continuing the previous example, the backlog count for the as-is scenario (10), the backlog count for a 20% increase in ticket volume (13), and the backlog count for a change in FTE (10).

Returning to FIG. 6, process 600 may include providing information associated with the modified project report or information associated with comparing the modified project report and the project report (block 640). For example, analytics platform 215 may provide the information associated with the modified project report and/or the information associated with comparing the modified project report and the project report. In some implementations, analytics platform 215 may provide the information associated with the modified project report to user device 205 in a manner similar to that described above with regard to block 440 of FIG. 4. For example, analytics platform 215 may provide the information via one or more user interfaces described above in connection with FIGS. 7A-7G.

In some implementations, analytics platform 215 may provide the information associated with the comparison of the modified project report and the project report. Here, the information associated with the comparison may be provided for display to the user such that the user may view the information associated with the comparison. Additionally, or alternatively, analytics platform 215 may provide the information associated with the comparison in order to cause an action to be automatically performed.

For example, analytics platform 215 may provide the information associated with the comparison in order to cause a shift and/or personnel, associated with the modified group information, to be scheduled in accordance with the modified project information (e.g., when the modified group information may result in improved performance of application maintenance).

As another example, analytics platform 215 may provide the information associated with the comparison in order to cause the performance of the application maintenance to be modified based on the modified ticket information (e.g., when modified ticket type priorities and/or requirements may result in improved performance of application maintenance).

As another example, analytics platform 215 may provide the information associated with the comparison in order to cause a review of the application maintenance project to be automatically scheduled (e.g., when modified group information indicates that the application maintenance project may be executed with reduced resource consumption).

As another example, analytics platform 215 may provide a recommendation based on comparing the project report and the modified project report (e.g., a recommendation of whether the application maintenance project should be modified in accordance with the modified project report).

In this way, performance of application maintenance may be improved by, for example, allowing for efficient and effective allocation of resources based on generating a modified project report and comparing the modified project report to the project report. This leads to improved overall performance and/or operation of the application due to the efficient and/or effective allocation of such resources, thereby allowing system software and hardware (e.g., associated with executing and/or hosting the application) to function more efficiently and/or effectively.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Additionally, as indicated above, FIGS. 7A-7G are provided merely as examples. Other examples are possible and may differ from what was described with regard to FIGS. 7A-7G.

In this way, performance of application maintenance may be improved by, for example, allowing for efficient and effective allocation of resources (e.g., computing resources, or personnel) for performing application maintenance. Additionally, the performance of application maintenance may be improved based on the project report and/or the modified project report, thereby improving overall performance of the application. Furthermore, improved performance of the application, resulting from the improved application maintenance, may allow system software and hardware (e.g., associated with performing the application) to function more efficiently and/or effectively.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
   one or more processors to:
      receive group information, associated with performing application maintenance, that includes information corresponding to one or more resources, associated with performing the application maintenance, and information associated with one or more shifts of the one or more resources;
      receive ticket information, associated with performing the application maintenance, that includes priority information and effort information associated with a plurality of ticket types associated with performing the application maintenance,
         the priority information indicating, for each ticket type of the plurality of ticket types, a respective measure of priority, and
         the effort information indicating, for each ticket type of the plurality of ticket types, a respective measure of effort associated with resolving a ticket of the ticket type;
      simulate, based on the group information, the ticket information, and the priority information, performing the application maintenance by using a virtual clock based simulation engine to determine a simulation result,
         the simulation result including information associated with one or more predicted performance metrics associated with performing the application maintenance;
      receive modified information associated with performing the application maintenance,
         the modified information including modified group information that is different from the group information, or
         the modified information including modified ticket information that is different from the ticket information;
      simulate, based on the modified information, performing the application maintenance to determine a modified simulation result,
         the modified simulation result including modified performance information associated with the one or more predicted performance metrics;
      identify, based on a comparison of the simulation result and the modified simulation result, an improvement in predicted performance of the application maintenance,
         the improvement corresponding to the modified simulation result;
      provide, based on identifying the improvement in the predicted performance, the modified information to automatically cause at least one resource, associated with the one or more resources, to be scheduled to perform the application maintenance; and
      automatically add an event to a calendar for the one or more resources based on providing the modified information and the at least one resource to perform the application maintenance.

2. The device of claim 1, where the one or more processors are further to:
   provide a notification that the modified simulation result indicates the improvement in the predicted performance.

3. The device of claim 2, where the one or more processors are further to:
   provide a recommendation associated with achieving the improvement in the predicted performance.

4. The device of claim 1, where the one or more processors are further to:
   provide historical ticket information, associated with performing the application maintenance for one or more applications, as input to a predictive model; and
   where the one or more processors, when receiving the ticket information, are to:

receive the ticket information as an output of the predictive model.

5. The device of claim 1, where the information associated with the one or more predicted performance metrics includes a notification of whether the simulation result indicates that the simulated performance of the application maintenance satisfies a service level agreement associated with performing the application maintenance.

6. The device of claim 1, where the modified performance information associated with the one or more predicted performance metrics indicates that the application maintenance can be performed with reduced computing resource consumption relative to a computing resource consumption associated with the group information and the ticket information.

7. The device of claim 1, where the one or more processors, when simulating performing the application maintenance to determine the simulation result, are to:
  simulate performing the application maintenance by using the virtual clock based simulation engine that creates a ticket queue based on ticket inflow rates during a simulated day,
    where a variance of the ticket inflow rates simulates actual ticket inflow associated with the application maintenance.

8. A method, comprising:
  determining, by a device, group information associated with an application maintenance project,
    the group information including information corresponding to one or more resources associated with the application maintenance project, and
    the group information including information associated with one or more shifts of the one or more resources;
  determining, by the device, ticket information associated with the application maintenance project,
    the ticket information including priority information and effort information associated with a plurality of ticket types associated with the application maintenance project,
      the priority information indicating, for each ticket type of the plurality of ticket types, a respective measure of priority, and
      the effort information indicating, for each ticket type of the plurality of ticket types, a respective measure of effort associated with resolving a ticket of the ticket type;
  simulating, by the device and based on the group information, the ticket information, and the priority information, a performance of application maintenance, associated with the application maintenance project, by using a virtual clock based simulation engine to determine a simulation result,
    the simulation result including information associated with one or more predicted performance metrics associated with the simulated performance of the application maintenance;
  receiving, by the device, modified information associated with the application maintenance project,
    the modified information including modified group information, associated with the application maintenance project, that differs from the group information, or
    the modified information including modified ticket information, associated with the application maintenance project, that differs from the ticket information;
  simulating, by the device and based on the modified information, another performance of application maintenance, associated with the application maintenance project, to determine a modified simulation result,
    the modified simulation result including modified performance information associated with the one or more predicted performance metrics;
  identifying, by the device and based on a comparison of the simulation result and the modified simulation result, an improvement in predicted performance of the application maintenance,
    the improvement corresponding to the modified simulation result; and
  providing, by the device and based on identifying the improvement in the predicted performance, the modified information to automatically cause one or more resources, associated with a group of resources, to be scheduled to perform the application maintenance; and
  automatically adding, by the device, an event to a calendar for the group of resources based on scheduling the performance of the application maintenance.

9. The method of claim 8, further comprising:
  providing a notification that the modified simulation result indicates the improvement in the predicted performance.

10. The method of claim 8, where determining the group information or determining the ticket information comprises:
  determining the group information or determining the ticket information based on information provided by an application maintenance server associated with the application maintenance project.

11. The method of claim 8, further comprising:
  providing historical ticket information, associated with the application maintenance project, as input to a predictive model; and
  where determining the ticket information further comprises:
    determining the ticket information based on an output of the predictive model.

12. The method of claim 8, where the information associated with the one or more predicted performance metrics includes a notification of whether the simulation result indicates that the simulated performance of the application maintenance satisfies a service level agreement associated with the application maintenance project.

13. The method of claim 8, where the modified performance information associated with the one or more predicted performance metrics indicates that the application maintenance can be performed with reduced computing resource consumption relative to a computing resource consumption associated with the group information and the ticket information.

14. The method of claim 8, where simulating performing the application maintenance to determine the simulation result comprises:
  simulating performing the application maintenance by using the virtual clock based simulation engine that creates a ticket queue based on ticket inflow rates during a simulated day,
    where a variance of the ticket inflow rates simulates actual ticket inflow associated with the application maintenance.

15. A non-transitory computer-readable medium storing instructions, the instructions comprising:
  one or more instructions that, when executed by one or more processors, cause the one or more processors to:

receive group information, associated with performing application maintenance, that includes information corresponding to one or more resources, associated with performing the application maintenance, and information associated with one or more shifts of the one or more resources;

receive ticket information, associated with performing the application maintenance, that includes priority information and effort information associated with a set of ticket types associated with performing the application maintenance, the priority information indicating, for each ticket type of the set of ticket types, a respective measure of priority, and the effort information indicating, for each ticket type of the set of ticket types, a respective measure of effort associated with resolving a ticket of the ticket type;

simulate, based on the group information, the ticket information, and the priority information, performance of the application maintenance by using a virtual clock based simulation engine to determine a simulation result, the simulation result including information associated with one or more predicted performance metrics associated with the simulated performance of the application maintenance;

receive modified information associated with performing the application maintenance, the modified information including modified group information that is different from the group information, or the modified information including modified ticket information that is different from the ticket information;

simulate, based on the modified information, performing the application maintenance to determine a modified simulation result, the modified simulation result including modified performance information associated with the one or more predicted performance metrics;

identify, based on a comparison of the simulation result and the modified simulation result, an improvement in predicted performance of the application maintenance, the improvement corresponding to the modified simulation result;

provide, based on identifying the improvement in the predicted performance, the modified information to automatically cause one or more resources, associated with a group of resources, to be scheduled to perform the application maintenance; and automatically add an event to a calendar for the group of resources based on scheduling the performance of the application maintenance.

16. The non-transitory computer-readable medium of claim 15, where the one or more instructions, when executed by the one or more processors, further cause the one or more processors to:

provide a notification that the modified simulation result indicates the improvement in the predicted performance.

17. The non-transitory computer-readable medium of claim 15, where the one or more instructions, when executed by the one or more processors, further cause the one or more processors to:

provide historical group information, associated with performing other application maintenance for another application, as input to a predictive model; and where the instructions, that cause the one or more processors to receive the group information, cause the one or more processors to:

receive the group information based on an output of the predictive model.

18. The non-transitory computer-readable medium of claim 15, where the one or more instructions, that cause the one or more processors to provide the modified information, cause the one or more processors to:

provide the modified information to cause an action, associated with performing the application maintenance, to be automatically performed.

19. The non-transitory computer-readable medium of claim 15, where the modified performance information associated with the one or more predicted performance metrics indicates that the application maintenance can be performed with reduced computing resource consumption relative to a computing resource consumption associated with the group information and the ticket information.

20. The non-transitory computer-readable medium of claim 15, where the one or more instructions, that cause the one or more processors to simulate performing the application maintenance to determine the simulation result, cause the one or more processors to:

simulate performing the application maintenance by using the virtual clock based simulation engine that creates a ticket queue based on ticket inflow rates during a simulated day, where a variance of the ticket inflow rates simulates actual ticket inflow associated with the application maintenance.

* * * * *